United States Patent
Kawasaki

(10) Patent No.: US 9,300,256 B2
(45) Date of Patent: Mar. 29, 2016

(54) AMPLIFICATION DEVICE AND AMPLIFICATION METHOD

(71) Applicant: FUJITSU LIMITED, Kawasaki-shi, Kanagawa (JP)

(72) Inventor: Toshio Kawasaki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/874,845

(22) Filed: May 1, 2013

(65) Prior Publication Data

US 2013/0335140 A1 Dec. 19, 2013

(30) Foreign Application Priority Data

Jun. 19, 2012 (JP) ................................. 2012-138065

(51) Int. Cl.
*H03F 1/26* (2006.01)
*H03F 1/42* (2006.01)
*H03F 1/02* (2006.01)
*H03F 1/32* (2006.01)
*H03F 3/24* (2006.01)

(52) U.S. Cl.
CPC ............... *H03F 1/42* (2013.01); *H03F 1/0294* (2013.01); *H03F 1/3247* (2013.01); *H03F 3/24* (2013.01)

(58) Field of Classification Search
CPC ........................................................ H03F 1/26
USPC ................ 330/149; 375/296–297; 455/114.3
See application file for complete search history.

(56) References Cited

U.S. PATENT DOCUMENTS

| 6,054,896 A * | 4/2000 | Wright et al. ................. 330/149 |
| 2011/0068868 A1 | 3/2011 | Shi et al. |
| 2013/0162348 A1* | 6/2013 | Bai et al. .......................... 330/75 |

FOREIGN PATENT DOCUMENTS

| JP | 03-101447 A | 4/1991 |
| JP | 05-037263 A | 2/1993 |
| JP | 08-031886 B2 | 3/1996 |
| JP | 2000-349575 A | 12/2000 |
| JP | 2002-506309 A | 2/2002 |
| JP | 2004-343665 A | 12/2004 |
| JP | 2008-167289 A | 7/2008 |
| JP | 2011-066894 A | 3/2011 |
| JP | 2011-193472 A | 9/2011 |
| JP | 2012-095005 A | 5/2012 |
| WO | WO 99/45642 A1 | 9/1999 |
| WO | WO 2010/147754 A1 | 12/2010 |

OTHER PUBLICATIONS

Partial Japanese Office Action issued on Sep. 15, 2015; Japanese Application No. 2012-138065.

* cited by examiner

*Primary Examiner* — Khanh V Nguyen
*Assistant Examiner* — Khiem Nguyen
(74) *Attorney, Agent, or Firm* — Arent Fox LLP

(57) ABSTRACT

An amplification device includes a first filter configured to pass a predetermined frequency component of a first digital signal phase-modulated with a constant amplitude; a first distortion compensator configured to compensate the signal output from the first filter in advance for distortion occurring in an amplified signal, based on a first distortion compensation coefficient dependent on an amplitude of the signal output from the first filter; a first converter configured to convert the signal compensated by the first distortion compensator into a first analog signal; and a first amplifier configured to amplify the first analog signal.

6 Claims, 18 Drawing Sheets

AMPLIFICATION DEVICE AND AMPLIFICATION METHOD

CROSS-REFERENCE TO RELATED APPLICATION

This application is based upon and claims the benefit of priority of the prior Japanese Patent Application No. 2012-138065, filed on Jun. 19, 2012, the entire contents of which are incorporated herein by reference.

FIELD

The embodiments discussed herein are related to an amplification device and an amplification method.

BACKGROUND

As one of devices for implementing a high-efficiency linear amplifier, there is a high frequency amplification circuit which employs an amplifier using linear amplification with nonlinear components (LINC).

FIG. 1 is a diagram illustrating an example of the amplifier using LINC. In the amplifier 10 using LINC, a LINC signal generator 2 separates an input modulated signal Sin(t) into a pair of phase-modulated signals Sc1(t) and Sc2(t) having a phase difference corresponding to an amplitude of the input modulated signal Sin(t) and generates the pair of the phase-modulated signals Sc1t) and Sc2(2). For example, the input modulated signal Sin(t) is a modulated signal subjected to an amplitude modulation and a phase modulation (angle modulation), and the pair of phase-modulated signals Sc1(t) and Sc2(t) are constant amplitude phase-modulated signals forming a constant envelope. The input modulated signal Sin(t) and the pair of phase-modulated signals Sc1(t) and Sc2(t) here may be all baseband signals, or may be all intermediate frequency (IF) signals. The LINC signal generator 2 outputs the pair of phase-modulated signals Sc1(t) and Sc2(t) as a digital signal.

Here, the signals Sin(t), Sc1(t) and Sc2(t) are expressed, for example, as follows.

$$\text{Sin}(t) = a(t) \cdot \cos\theta(t)$$

$$Sc1(t) = a_{max} \cdot \cos(\theta(t) + \psi(t))$$

$$Sc2(t) = a_{max} \cdot \cos(\theta(t) - \psi(t))$$

$$\psi(t) = \cos^{-1}\left(\frac{a(t)}{2 \cdot a_{max}}\right)$$

where a(t) indicates an amplitude component of the input modulated signal Sin(t), and θ(t) indicates a phase component of the input modulated signal Sin(t). A phase modulation is performed so as to generate a phase difference 2×ψ(t) corresponding to the amplitude a(t). In addition, $a_{max}$ indicates the maximum value of the amplitude a(t) and is a constant. The signals Sc1(t) and Sc2(t) are constant envelope signals. That is to say, the amplitudes of the signals Sc1(t) and Sc2(t) are constant.

The signal Sc1(t) that is one of the pair of phase-modulated signals output from the LINC signal generator 2 is converted from a digital signal to an analog signal by a digital to analog converter (DAC) 16. In addition, the converted analog signal passes through a low-pass filter 18, and thereby a component corresponding to a frequency band of the signal Sc1(t) that is one of the pair of phase-modulated signals is extracted and other frequency components are suppressed. Similarly, the signal Sc2(t) that is the other of the pair of phase-modulated signals is converted from a digital signal to an analog signal by a DAC 36. In addition, the converted analog signal passes through a low-pass filter 38, and thereby a component corresponding to a frequency band of the signal Sc2(t) that is the other of the pair of phase-modulated signals is extracted and other frequency components are suppressed.

In the amplifier 10 using LINC, a quadrature modulator 20 performs a quadrature modulation on the signal Sc1(t) that is one of the pair of phase-modulated signals and has passed the low-pass filter 18. A frequency converter 22 generates and outputs a signal S1(t) that is a radio frequency (RF) signal and one of a pair of high frequency signals, by using a high frequency signal (oscillation signal) output from an oscillator (not illustrated). Similarly, a quadrature modulator 40 performs a quadrature modulation on the signal Sc2(t) that is the other of the pair of phase-modulated signals and has passed the low-pass filter 38. A frequency converter 42 generates and outputs a signal S2(t) that is an RF signal and the other of the pair of high frequency signals, by using a high frequency signal (oscillation signal) output from an oscillator (not illustrated).

The high frequency signal S1(t) and the high frequency signal S2(t) are expressed as follows. Here, a radio frequency (a frequency of the oscillator) is indicated by fc.

$$S1(t)=a_{max}\cdot\cos(2\pi\cdot fc\cdot t+\theta(t)+\psi(t))$$

$$S2(t)=a_{max}\cdot\cos(2\pi\cdot fc\cdot t+\theta(t)-\psi(t))$$

A pair of amplifiers include two amplifiers 24 and 44 which are provided in parallel. Gain and phase characteristics of the two amplifiers 24 and 44 are substantially the same. The amplifiers 24 and 44 amplify the high frequency signals output from the frequency converters 22 and 42, respectively.

A combiner 52 combines the pair of high frequency signals amplified by the pair of amplifiers 24 and 44 and outputs the combined signal as a high frequency signal Sout(t). The signal Sout(t) output from the combiner 52 is expressed as follows when the gain of the pair of amplifiers 24 and 44 is indicated by G.

$$\begin{aligned}Sout(t) &= G\cdot a_{max}\cdot\cos(2\pi\cdot fc\cdot t+\theta(t)+\psi(t)+\phi)+\\ &\quad G\cdot a_{max}\cdot\cos(2\pi\cdot fc\cdot t+\theta(t)-\psi(t)+\phi)\\ &= 2G\cdot a_{max}\cdot\cos(2\pi\cdot fc\cdot t+\theta(t)+\phi)\cos(\psi(t))\\ &= 2G\cdot a(t)\cdot\cos(2\pi\cdot fc\cdot t+\theta(t)+\phi)\end{aligned}$$

Here, φ is a passing phase of the pair of high frequency signals S1(t) and S2(t).

Japanese Examined Patent Application Publication No. 08-31886, Japanese Laid-open Patent Publication No. 05-37263, Japanese Laid-open Patent Publication No. 2004-343665, Japanese Laid-open Patent Publication No. 2008-167289, Japanese National Publication of International Patent Application No. 2002-506309, Japanese Laid-open Patent Publication No. 2000-349575, and Japanese Laid-open Patent Publication No. 2011-193472 are examples of the related art.

SUMMARY

According to an aspect of the invention, an amplification device includes a first filter configured to pass a predetermined frequency component of a first digital signal phase-modulated with a constant amplitude; a first distortion compensator configured to compensate the signal output from the first filter in advance for distortion occurring in an amplified signal, based on a first distortion compensation coefficient dependent on an amplitude of the signal output from the first filter; a first converter configured to convert the signal compensated by the first distortion compensator into a first analog signal; and a first amplifier configured to amplify the first analog signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

When a signal such as a PSK signal in which a carrier polarity is reversed is input as an input modulated signal to a high frequency amplification circuit which employs an amplifier using LINC, points where a phase is reversed by 180 degrees are present in a pair of phase-modulated signals Sc1(t) and Sc2(t) generated by a LINC signal generator, and thereby frequency bandwidths of the signals increase.

Figure 2:
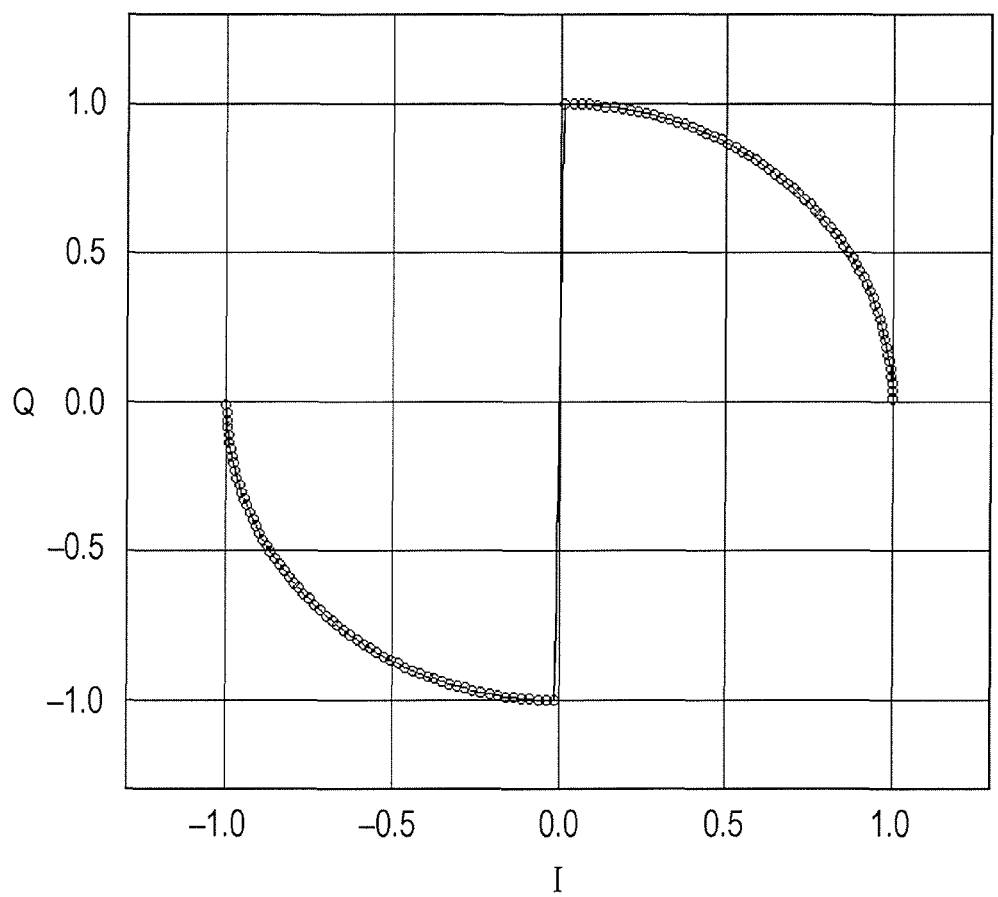
FIG. 2 is a diagram illustrating an example of a digital signal sequence constellation in a case where an input modulated signal is a two-tone signal.

FIG. 2 is a diagram illustrating an example of the digital signal sequence constellation in a case where an input modulated signal is a two-tone signal. FIG. 2 illustrates, for example, the signal Sc1(t). In the example of FIG. 2, the signal is a constant envelope signal. In the example of FIG. 2, a phase is reversed by 180 degrees between the point of (I, Q)=(0, −1) and the point of (I, Q)=(0, 1).

However, a pair of phase-modulated signals Sc1(t) and Sc2(t) which are digital signals can express only a half of a sampling frequency according to the Nyquist theorem. For this reason, signals which are converted into analog signals by DACs 16 and 36, and from which alias components are removed by low-pass filters 18 and 38 cause a large ringing and thus become signals different from constant envelope signals.

Figure 3:
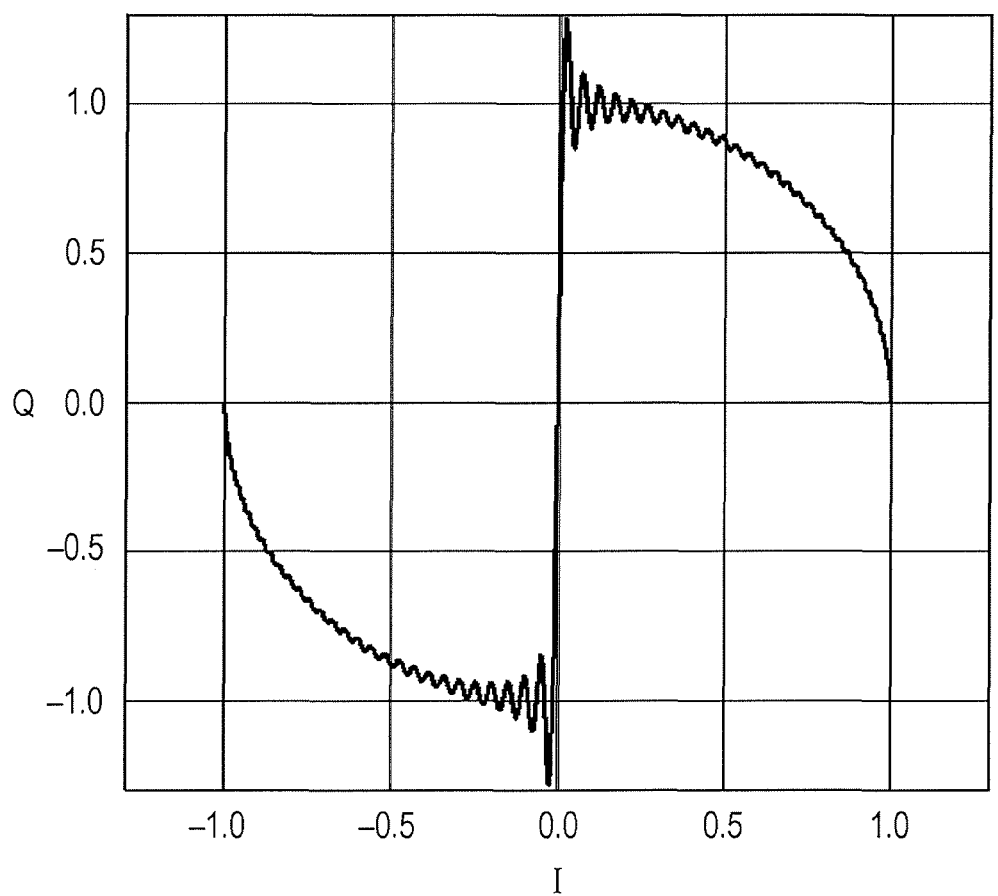
FIG. 3 is a diagram illustrating an example of the constellation after the signal in FIG. 2 is converted into an analog signal by a DAC.

FIG. 3 is a diagram illustrating an example of the constellation after the signal in FIG. 2 is converted into an analog signal by the DAC and a high frequency component is removed by the low-pass filter. FIG. 3 illustrates a signal (analog signal) into which, for example, the signal Sc1(t) is analog-converted by the DAC.

An amplitude component of the analog signal is varied by ringing. That is to say, the amplitude component of the analog signal is not constant. When the analog signals are amplified by a pair of amplifiers, the analog signals are influenced by AM/AM characteristics or AM/PM characteristics (AM/AM distortion or AM/PM distortion) of the pair of amplifiers. The output high frequency signal Sout(t) after being combined deteriorates due to the distortion. In other words, distortion occurs in the output high frequency signal Sout(t). The AM/AM characteristics indicate an amplitude of an output signal to an amplitude of an input signal. The AM/AM distortion is distortion due to the AM/AM characteristics. The AM/PM characteristics indicate phase rotation of an output signal to an amplitude of an input signal. The AM/PM distortion is distortion due to the AM/PM characteristics.

The amplitude component of the analog signal varies with the time, but digital signals input to the DAC 16 and 36 are constant envelope signals. In other words, envelopes of the digital signals input to the DAC 16 and 36 do not vary with the time. For this reason, it is difficult to perform a digital predistortion process on the digital signals input to the DAC 16 and 36 in order to compensate for the nonlinear characteristics of the amplifiers.

Figure 1:
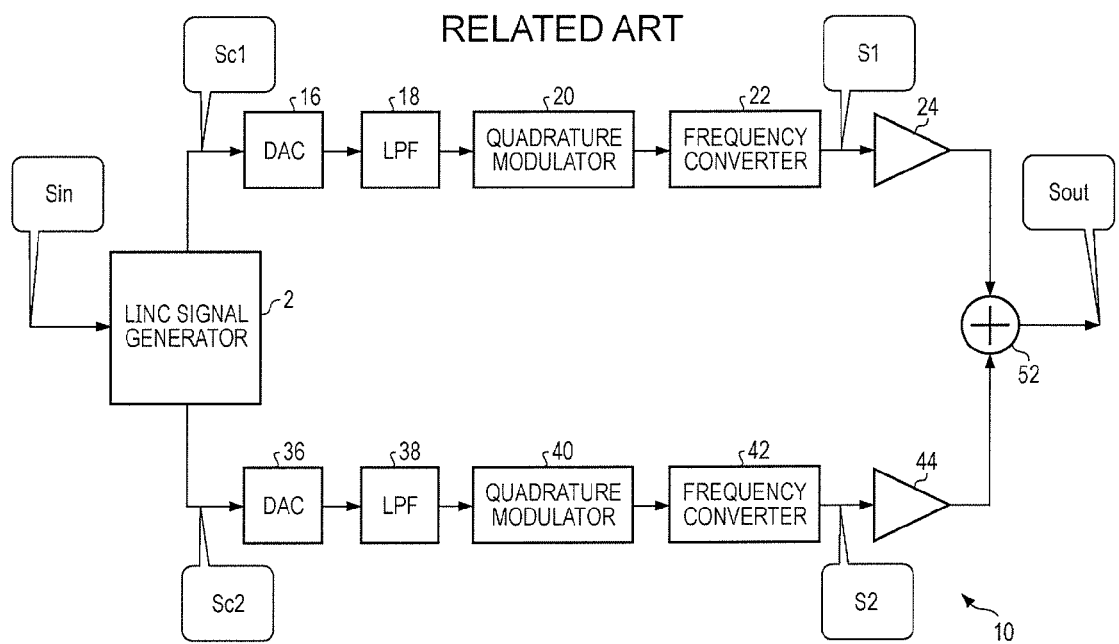
FIG. 1 is a diagram illustrating an example of the amplifier using LINC.
Figure 4:
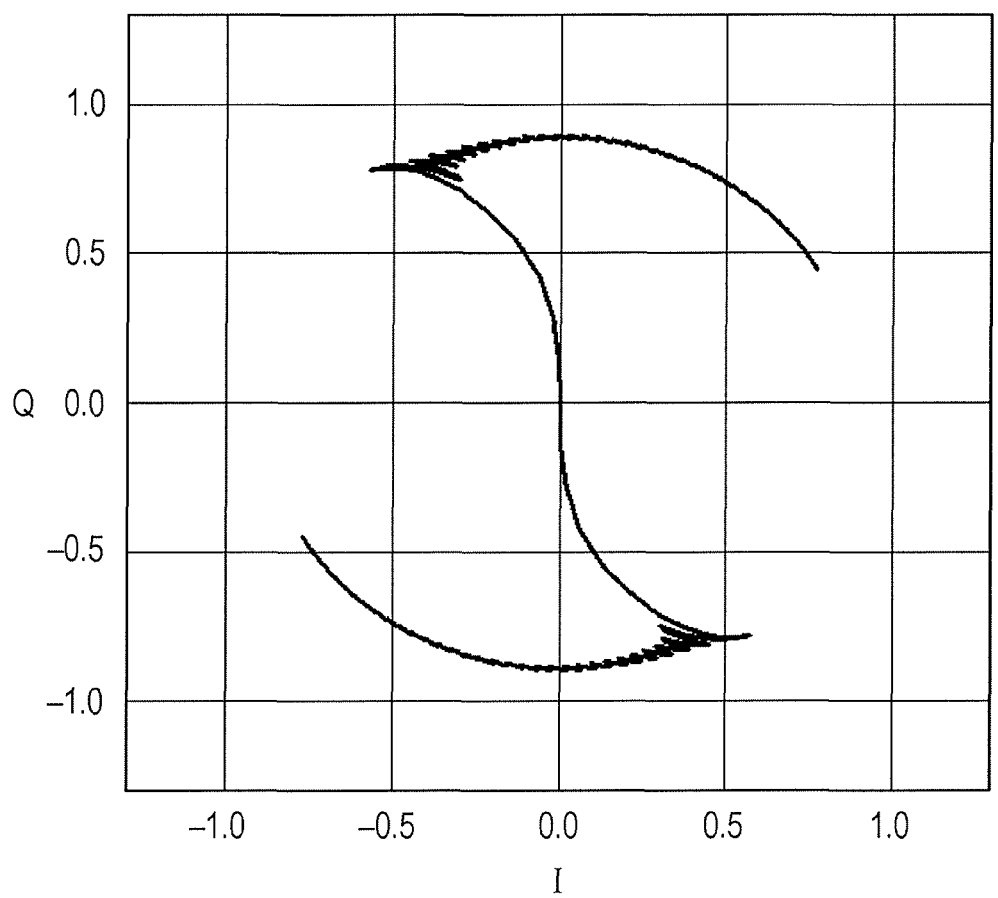
FIG. 4 is a diagram illustrating an example of the constellation of an output of an amplifier in FIG. 1.

FIG. 4 illustrates an example of the constellation of an output of the amplifier 24 in FIG. 1. FIG. 4 illustrates an output when the signal illustrated in FIG. 3 is input to the amplifier 24. The output of the amplifier 24 is influenced by the AM/AM distortion and the AM/PM distortion.

Figure 5:
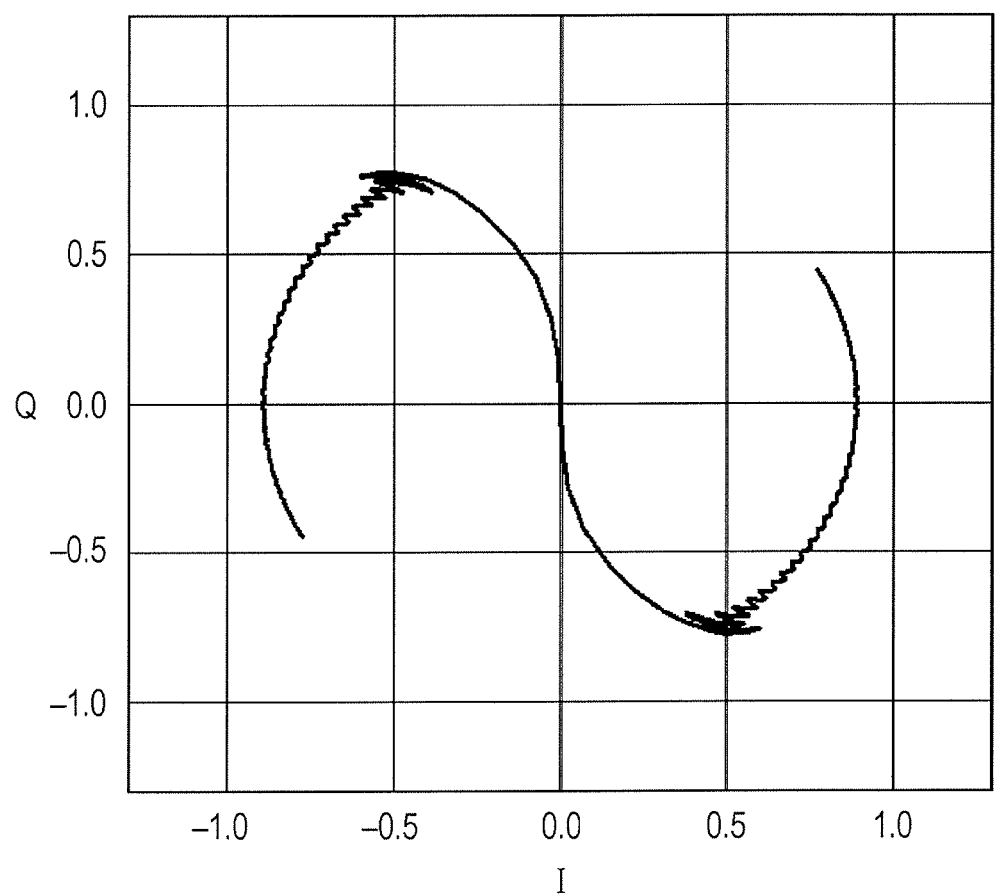
FIG. 5 is a diagram illustrating an example of the constellation of an output of another amplifier in FIG. 1.

FIG. 5 illustrates an example of the constellation of an output of the amplifier 44 in FIG. 1. FIG. 5 illustrates an output when a signal forming a pair with the signal illustrated in FIG. 3 is input to the amplifier 44. The output of the amplifier 44 is influenced by the AM/AM distortion and the AM/PM distortion.

Figure 6:
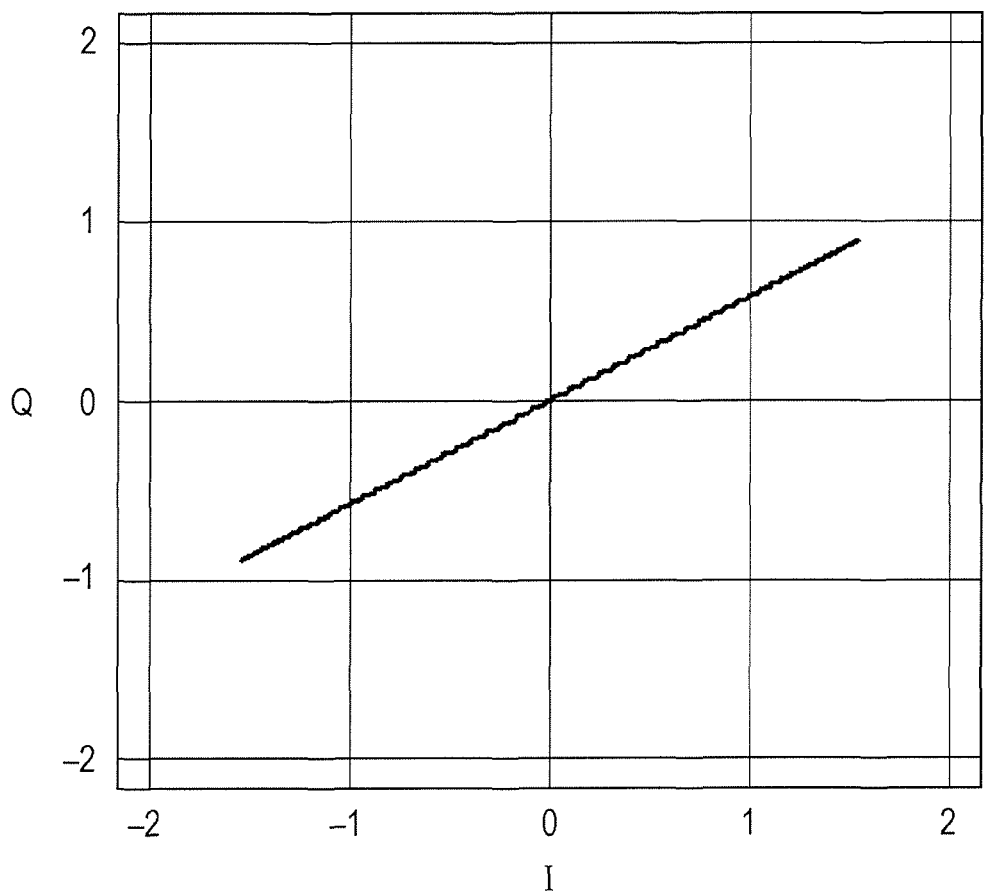
FIG. 6 is a diagram illustrating an example of the constellation of an output of a combiner which combines the signal in FIG. 4 and the signal in FIG. 5.

FIG. 6 is a diagram illustrating an example of the constellation of an output of the combiner 52 which combines the signal in FIG. 4 and the signal in FIG. 5. If there is no influence of the distortion in the amplifiers 24 and 44, an output of the combiner 52 becomes a straight line which connects the point of (I, Q)=(−2, 0) to the point of (I, Q)=(2, 0). However, as illustrated in FIG. 6, the output of the combiner 52 rotates with respect to the origin and causes distortion due to the AM/AM distortion and the AM/PM distortion.

The above-described problem is not limited to the high frequency amplification circuit which employs the amplifiers using LINC and may be generated in an amplification circuit having an amplifier which amplifies a phase-modulated signal of which the amplitude is constant.

Embodiments to which an amplification device that suppresses deterioration in an output signal is applied will be described.

Hereinafter, embodiments will be described with reference to the drawings. Configurations of the embodiments are an example, and the disclosed configurations are not limited to specific configurations described in the embodiments. Specific configurations according to the embodiments may be employed in implementing the disclosed configurations. The respective embodiments may be combined as much as possible and be implemented.

First Embodiment

Configuration Example

Figure 7:
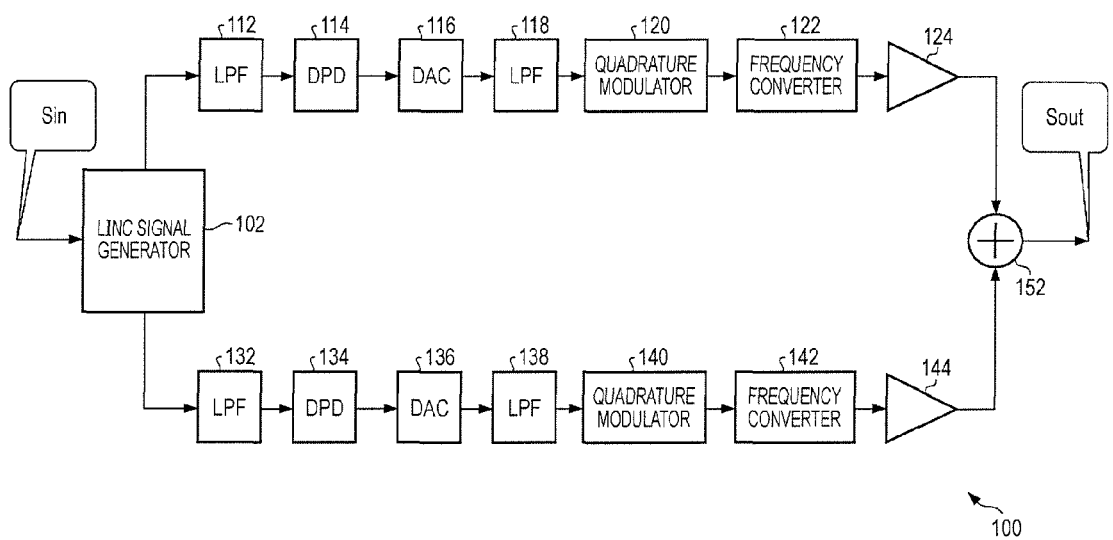
FIG. 7 is a diagram illustrating a configuration example of a distortion compensating apparatus according to First embodiment.

FIG. 7 is a diagram illustrating a configuration example of a distortion compensating apparatus according to First embodiment. The distortion compensating apparatus 100 includes a LINC signal generator 102, a first low-pass filter 112, a digital predistortion unit (DPD) 114, a digital to analog converter (DAC) 116, a second low-pass filter 118, a quadrature modulator 120, a frequency converter 122, and an amplifier 124. The distortion compensating apparatus 100 further includes a first low-pass filter 132, a DPD 134, a DAC 136, a second low-pass filter 138, a quadrature modulator 140, a frequency converter 142, an amplifier 144, and a combiner 152.

The LINC signal generator 102 separates an input modulated signal Sin(t) into a pair of phase-modulated signals Sc1(t) and Sc2(t) having a phase difference corresponding to the amplitude of the input modulated signal Sin(t) and generates the pair of phase-modulated signals Sc1(t) and Sc2(t). The signal Sc1(t) is output to the first low-pass filter 112. The signal Sc2(t) is output to the first low-pass filter 132. The input modulated signal Sin(t) is, for example, a baseband signal. The input modulated signal Sin(t) may be an intermediate frequency (IF) signal.

The first low-pass filter (LPF) 112 cuts a high frequency component of the signal output from the LINC signal generator 102.

The DPD 114 performs a distortion compensating process on an output of the first low-pass filter 112. The distortion compensating process herein is a process in which a signal before being amplified by the amplifier 124 is multiplied by a predistortion coefficient so as to generate distortion in advance, thereby cancelling distortion to be generated in the amplifier 124. The predistortion coefficient is a distortion compensation coefficient that compensates for the distortion in an amplifier. The predistortion coefficient by which an output of the first low-pass filter 112 is multiplied is dependent on the magnitude of an output of the first low-pass filter 112. The predistortion coefficient is a coefficient that compensates for distortion such that the amplitude of an output signal is proportional to the amplitude of an input signal and a phase difference between the input signal and the output signal becomes 0. The input signal and the predistortion coefficient are expressed by, for example, a complex number. The predistortion coefficient is obtained, for example, by comparing a plurality of certain input signals to the amplifier 124 with output signals of the amplifier 124 for the input signals in advance. The DPD 114 is an example of a distortion compensator.

The DAC 116 converts the digital signal which is an output of the DPD 114 into an analog signal.

The second low-pass filter (LPF) 118 cuts a high frequency component of the signal output from the DAC 116.

The quadrature modulator 120 performs a quadrature modulation on the signal output from the second low-pass filter 118 and outputs the modulated signal.

The frequency converter 122 includes an oscillator. The frequency converter 122 up-converts the signal subjected to the quadrature modulation by the quadrature modulator 120 into a signal with a radio frequency (RF). The frequency converter 122 generates and outputs a high frequency signal by using a high frequency signal (an oscillation signal) output from the oscillator.

The amplifier 124 power-amplifies the signal output from the frequency converter 122. The amplifier 124 outputs the amplified signal to the combiner 152. Here, it is assumed that a performance of the amplifier 124 does not vary. That is to say, it is assumed that the amplifier 124 generates a predetermined output for a predetermined input.

The first low-pass filter 132, the DPD 134, and the DAC 136 are respectively the same as the first low-pass filter 112, the DPD 114, and the DAC 116. The second low-pass filter 138, the quadrature modulator 140, the frequency converter 142, and the amplifier 144 are respectively the same as the second low-pass filter 118, the quadrature modulator 120, the frequency converter 122, and the amplifier 124.

The combiner 152 combines the output of the amplifier 124 with the output of the amplifier 144 so as to be output as a signal Sout(t). The signal output from the combiner 152 is transmitted from an antenna or the like.

Operation of Distortion Compensating Apparatus

An operation of the distortion compensating apparatus 100 will be described.

Figure 8:
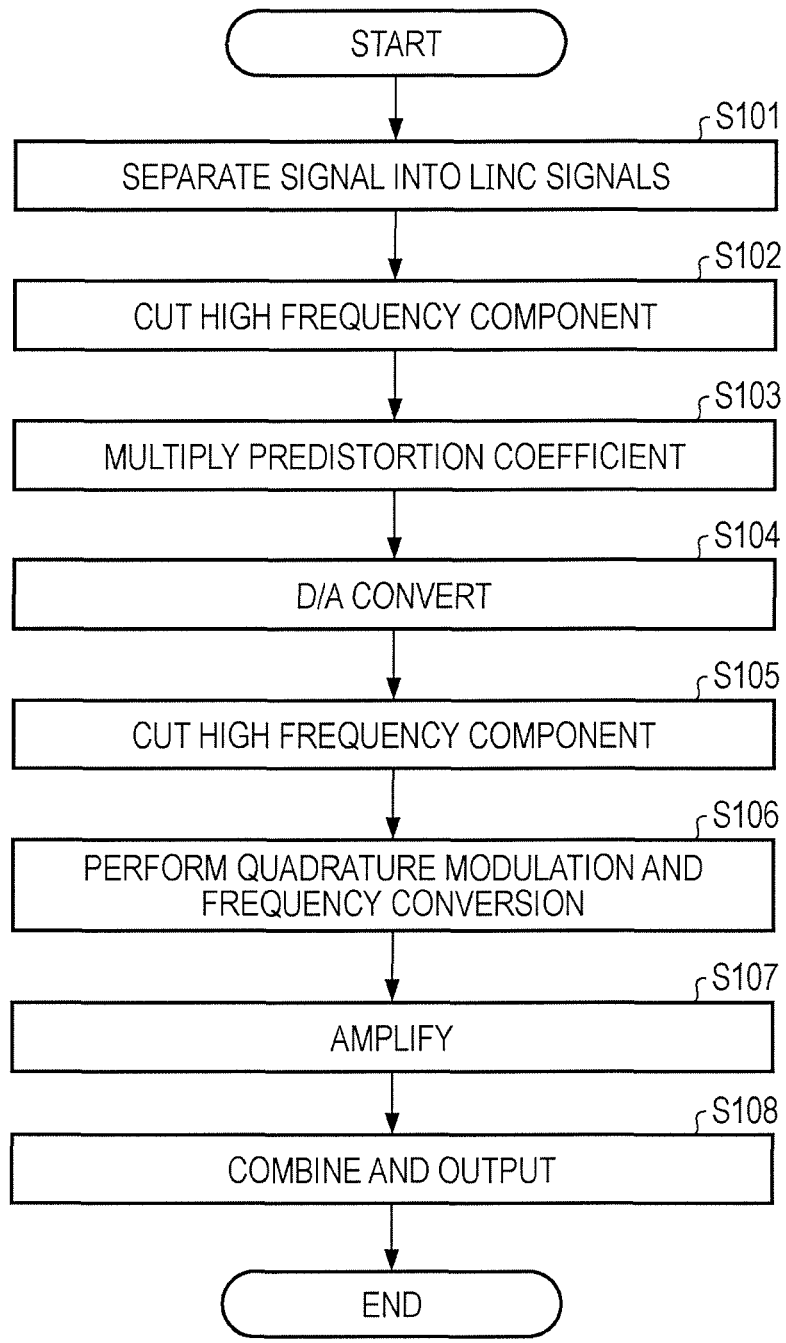
FIG. 8 is a diagram illustrating an example of an operation flow of the distortion compensating apparatus.

FIG. 8 is a diagram illustrating an example of the operation flow of the distortion compensating apparatus 100. The LINC signal generator 102 of the distortion compensating apparatus 100 receives a digital signal Sin(t) which is a signal to be transmitted. The signal used herein is a complex signal. The LINC signal generator 102 separates the received digital signal Sin(t) into a pair of phase-modulated signals Sc1(t) and Sc2(t) having a phase difference corresponding to the amplitude of the received digital signal Sin(t) (operation S101). The LINC signal generator 102 outputs the signal Sc1(t) to the first low-pass filter 112. The LINC signal generator 102 outputs the signal Sc2(t) to the first low-pass filter 132. The signals output from the LINC signal generator 102 are expressed, for example, using an amplitude and a phase. In addition, the signals output from the LINC signal generator 102 may be expressed using an in-phase (I) component and a quadrature phase (Q) component.

The first low-pass filter 112 cuts a high frequency component of the signal Sc1(t) (operation S102). The signal from which the high frequency component is cut is input to the DPD 114. A frequency band with band limitation by the first low-pass filter 112 is the same as a frequency band of the analog signal by the second low-pass filter 118 or is smaller than the frequency band of the analog signal by the second low-pass filter 118. Ringing occurs in a signal having passed through the first low-pass filter 112. In other words, even if a signal input to the first low-pass filter 112 is a constant envelope signal, an amplitude component of the signal output from the first low-pass filter 112 is not constant.

The DPD 114 multiplies the signal output from the first low-pass filter 112 by a predistortion coefficient and outputs the multiplied signal (operation S103). The predistortion coefficient is a coefficient that compensates for distortion (AM/AM distortion and AM/PM distortion) in the amplifier 124. The predistortion coefficient is dependent on the amplitude of an input signal. A correspondence relationship between the input signal and the predistortion coefficient is stored as, for example, a correspondence table in advance. In addition, the correspondence relationship between the input signal and the predistortion coefficient may be stored as a function of the input signal in advance. In the DPD 114, inverse characteristics to distortion characteristics to be given by the amplifier 124 is given by the predistortion coefficient to the signal output from the first low-pass filter 112. The signal obtained by multiplying the signal output from the first low-pass filter 112 by the predistortion coefficient is input to the amplifier 124, thereby obtaining a desired output in which distortion is suppressed.

The DAC 116 converts the digital signal output from the DPD 114 into an analog signal (operation S104).

The second low-pass filter 118 cuts a high frequency component of the analog signal converted by the DAC 116 (operation S105). The signal from which the high frequency component is cut is output to the quadrature modulator 120.

The quadrature modulator 120 performs a quadrature modulation on the signal output from the second low-pass filter 118. The frequency converter 122 converts a frequency of the signal output from the quadrature modulator 120 into a radio frequency by using a high frequency signal output from the oscillator and outputs the converted signal (operation S106).

The amplifier 124 amplifies the signal output from the frequency converter 122 (operation S107). The signal amplified by the amplifier 124 has been subjected to a distortion compensating process by the DPD 114 in advance.

The signal Sc2(t) output from the LINC signal generator 102 is processed by the first low-pass filter 132, the DPD 134, the DAC 136, the second low-pass filter 138, the quadrature modulator 140, the frequency converter 142, and the amplifier 144 in the same manner as the signal Sc1(t).

The combiner 152 combines the signal output from the amplifier 124 with the signal output from the amplifier 144 and outputs the combined signal (operation S108).

The distortion compensating apparatus 100 cuts the high frequency component of the digital signal generated by the LINC signal generator 102 so as to perform a digital predistortion process (a distortion compensating process) on the digital signal.

A series of processes may be executed by hardware or may be executed by software.

An operation executed by the software includes not only processes which are performed in a time series according to the described order but also processes which are performed in parallel or separately and not necessarily performed in a time series.

Figure 9:
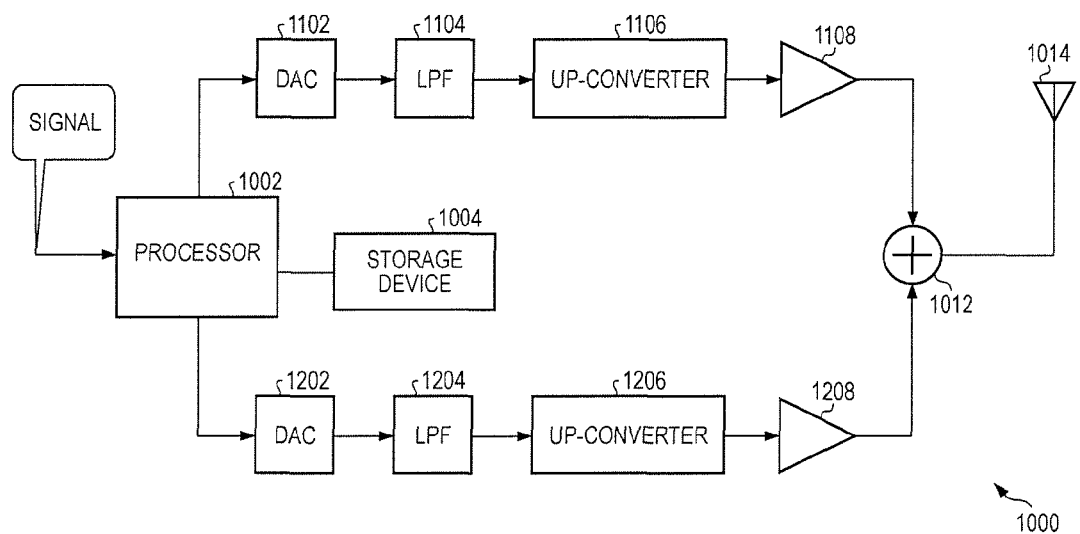
FIG. 9 is a diagram illustrating a hardware configuration example of the distortion compensating apparatus according to First embodiment.

Hardware Configuration Example of Distortion Compensating Apparatus According to First Embodiment FIG. 9 is a hardware configuration example of the distortion compensating apparatus according to First Embodiment. The distortion compensating apparatus 1000 up-converts an input digital signal into a signal with a radio frequency, and amplifies and outputs the up-converted signal. The distortion compensating apparatus 1000 includes a processor 1002, a storage device 1004, a DAC 1102, an LPF 1104, an up-converter 1106, and an amplifier 1108. The distortion compensating apparatus 1000 further includes a DAC 1202, an LPF 1204, an up-converter 1206, an amplifier 1208, a combiner 1012, and an antenna 1014. The distortion compensating apparatus 100 is implemented by a hardware configuration such as, for example, the distortion compensating apparatus 1000.

The processor 1002 is, for example, a central processing unit (CPU) or a digital signal processor (DSP). The processor 1002 controls the entire distortion compensating apparatus 1000. As the processor 1002, an application specific integrated circuit (ASIC) or a field-programmable gate array (FPGA) may be used.

The storage device 1004 is, for example, a random access memory (RAM) or a read only memory (ROM). In addition, the storage device 1004 is, for example, an erasable programmable read only memory (EPROM) or a hard disk drive (HDD). Further, a secondary storage device may include a removable medium, that is, a portable recording medium. The removable medium is, for example, a universal serial bus (USB) memory, or a disk storage medium such as a compact disk (CD) or a digital versatile disk (DVD). The storage device 1004 may store a correspondence table or the like indicating a correspondence relationship between an input signal and a predistortion coefficient.

The distortion compensating apparatus 1000 realizes the functions of the LINC signal generator 102, the first low-pass filter 112, the DPD 114, and the like by the processor 1002 executing a program stored in the storage device 1004.

The DAC 1102 converts a digital signal output from the processor 1002 into an analog signal. The DAC 1102 realizes the function of the DAC 116.

The LPF 1104 removes a high frequency component from the analog signal output from the DAC 1102. The LPF 1104 realizes the function of the second low-pass filter 118.

The up-converter 1106 has the functions of the quadrature modulator 120 and the frequency converter 122.

The amplifier 1108 amplifies the analog signal output from the up-converter 1106. Various amplifiers may be used as the amplifier 1108, and the amplifier 1108 and the amplifier 1208 preferably use amplifiers having the same characteristics.

The DAC 1202, the LPF 1204, the up-converter 1206, and the amplifier 1208 respectively have the same functions as the DAC 1102, the LPF 1104, the up-converter 1106, and the amplifier 1108.

The combiner 1012 combines the output of the amplifier 1108 with the output of amplifier 1208.

The antenna 1014 transmits the signal combined by the combiner 1012 to other apparatuses.

Operations and Effects of First Embodiment

The distortion compensating apparatus 100 cuts a high frequency component of the constant envelope digital signal generated by the LINC signal generator 102. Ringing occurs in the signal from which the high frequency component is cut. In other words, the amplitude component of the signal in which the high frequency component is cut from the constant envelope signal is not constant. The distortion compensating apparatus 100 performs a distortion compensating process of compensating for nonlinear distortion in the amplifier on the signal from which the high frequency component is cut. The distortion compensating apparatus 100 performs the distortion compensating process on the signal in which the ringing occurs, thereby suppressing deterioration in an output signal due to the ringing and the distortion characteristics of the amplifier. Further, the distortion compensating apparatus 100 performs frequency band limitation (cuts a high frequency component) on the digital signal, thereby performing a digital predistortion process (distortion compensating process) on the digital signal.

Figure 10:
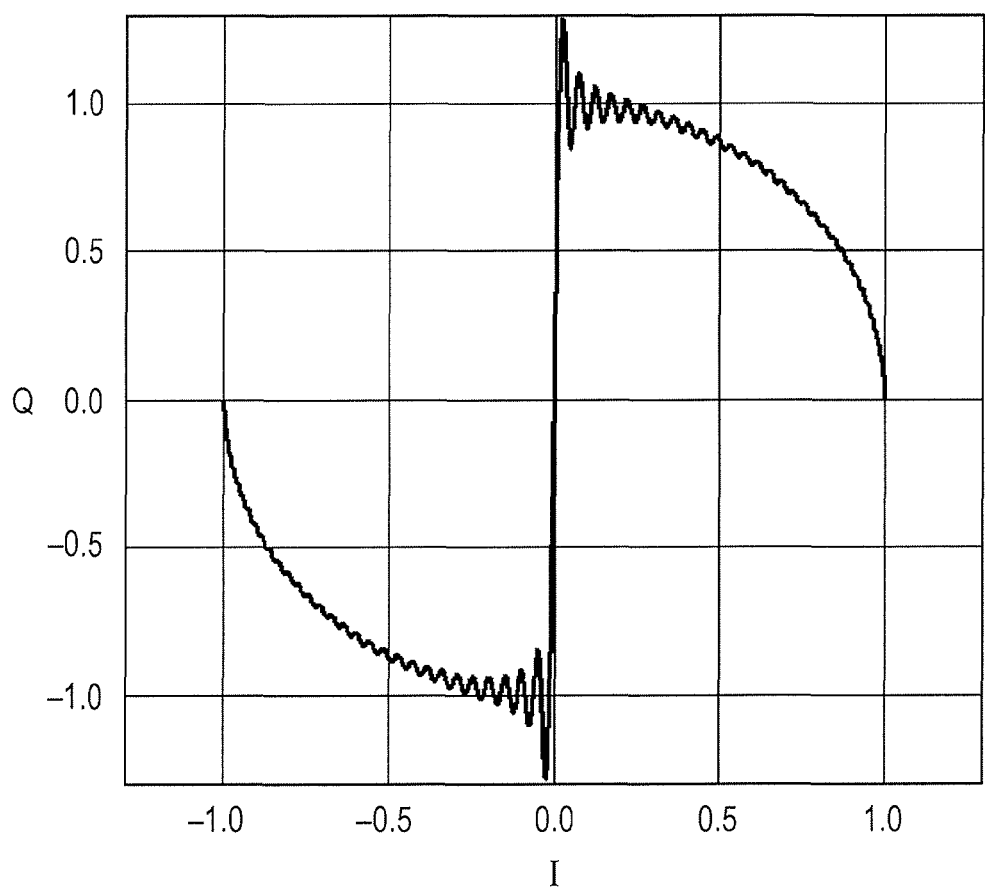
FIG. 10 is a diagram illustrating an example of the constellation of an output of an amplifier.

FIG. 10 is a diagram illustrating an example of the constellation of an output of the amplifier 124. FIG. 10 illustrates a signal when the signal as illustrated in FIG. 2 is output to the first low-pass filter 112 from the LINC signal generator 102, undergoes distortion compensation, and is output from the amplifier 124. The output of the amplifier 124 is influenced by ringing due to the first low-pass filter 112 but there are very little AM/AM distortion and AM/PM distortion.

Figure 11:
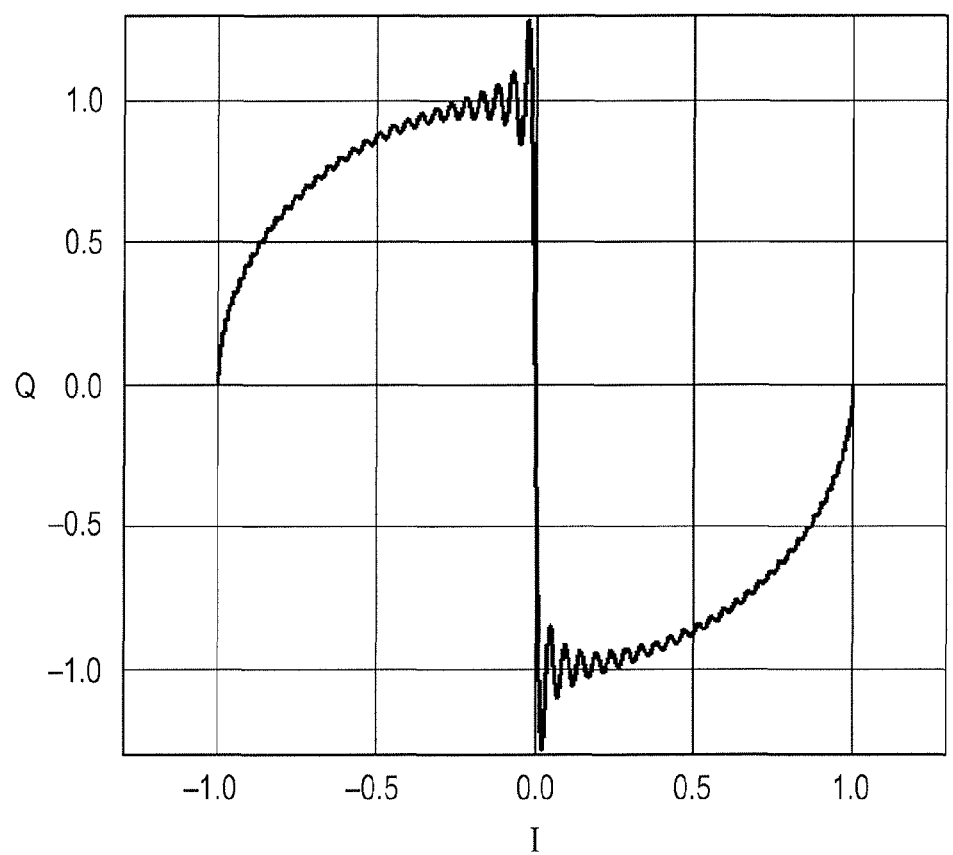
FIG. 11 is a diagram illustrating an example of the constellation of an output of another amplifier.

FIG. 11 is an example of the constellation of an output of the amplifier 144. FIG. 11 illustrates a signal when the signal that forms a pair with the signal as illustrated in FIG. 2 is output to the first low-pass filter 132 from the LINC signal generator 102, undergoes distortion compensation, and is output from the amplifier 144. The output of the amplifier 144 is influenced by ringing due to the first low-pass filter 132 but there are very little AM/AM distortion and AM/PM distortion.

Figure 12:
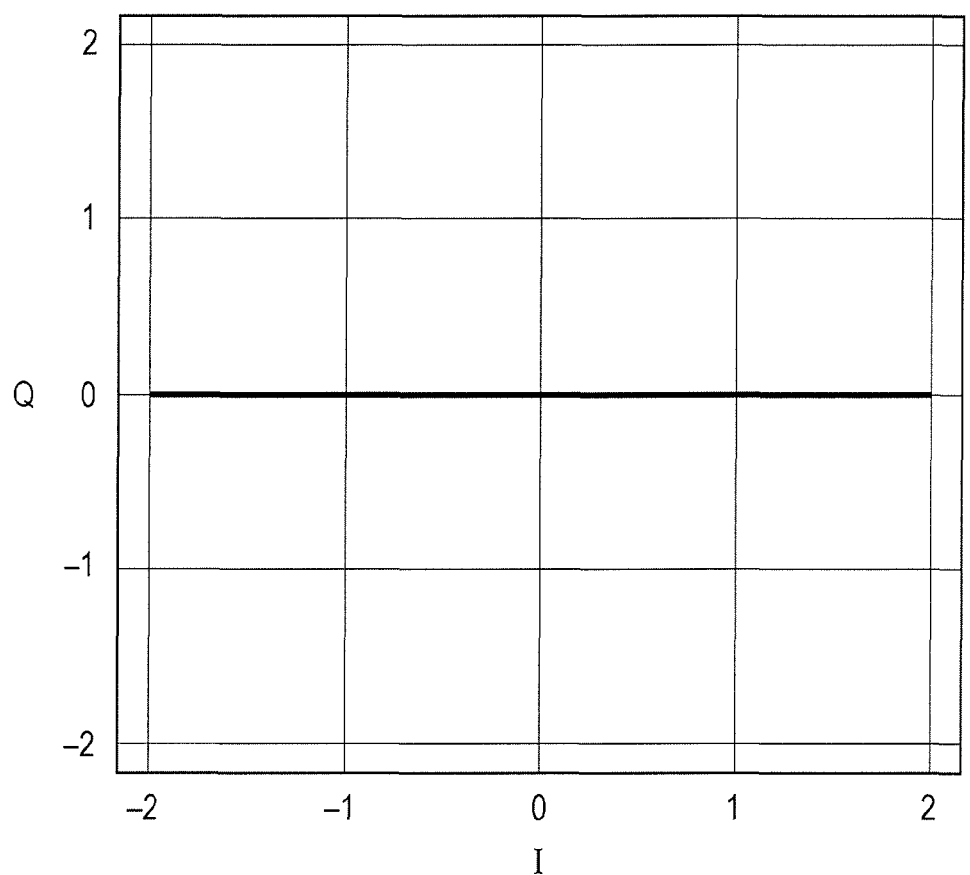
FIG. 12 is a diagram illustrating an example of the constellation of an output of a combiner which combines the signal in FIG. 10 and the signal in FIG. 11.

FIG. 12 is a diagram illustrating an example of the constellation of an output of the combiner 152 which combines the signal in FIG. 10 and the signal in FIG. 11. Unlike in the example of FIG. 6 in the related art, the output of the combiner 152 becomes a straight line which connects the point of (I, Q)=(−2, 0) to the point of (I, Q)=(2, 0). This is a desired output. That is to say, the distortion compensating apparatus 100 is able to output a signal in which deterioration in an output signal due to the ringing and the distortion characteristics of the amplifier is suppressed.

Second Embodiment

Next, Second Embodiment will be described. Second Embodiment has common features with First Embodiment. Therefore, differences will be mainly described, and description of the common features will be omitted.

In First Embodiment, the distortion characteristics of each amplifier are known, and the digital predistortion coefficient is obtained in advance. In Second Embodiment, a description will be made of a case where the distortion characteristics of respective amplifiers are not obtained in advance. In Second Embodiment, the digital predistortion coefficient is obtained based on an output of each amplifier.

Configuration Example

Figure 13:
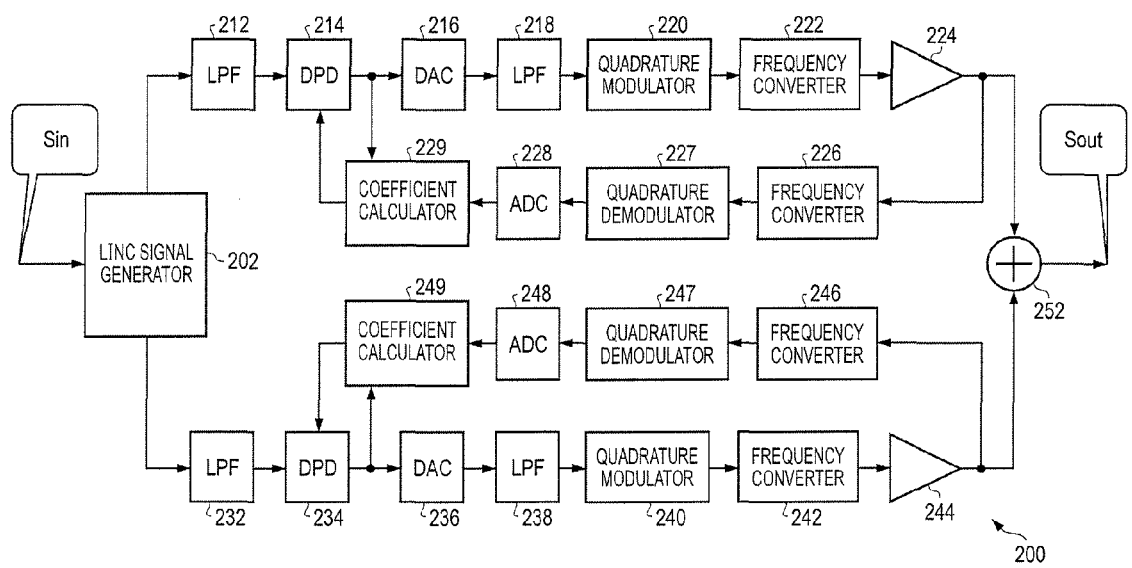
FIG. 13 is a diagram illustrating a configuration example of a distortion compensating apparatus according to Second Embodiment.

FIG. 13 is a diagram illustrating a configuration example of the distortion compensating apparatus according to Second Embodiment. The distortion compensating apparatus 200 includes a LINC signal generator 202, a first low-pass filter 212, a DPD 214, a DAC 216, a second low-pass filter 218, a quadrature modulator 220, a frequency converter 222, and an amplifier 224. The distortion compensating apparatus 200 further includes a frequency converter 226, a quadrature demodulator 227, an ADC 228, and a coefficient calculator 229. In addition, the distortion compensating apparatus 200 includes a first low-pass filter 232, a DPD 234, a DAC 236, a second low-pass filter 238, a quadrature modulator 240, a frequency converter 242, and an amplifier 244. The distortion compensating apparatus 200 further includes a frequency converter 246, a quadrature demodulator 247, an ADC 248, and a coefficient calculator 249. Further, the distortion compensating apparatus 200 includes a combiner 252.

The LINC signal generator 202, the first low-pass filter 212, the DPD 214, the DAC 216, the second low-pass filter 218, the quadrature modulator 220, the frequency converter 222, and the amplifier 224 respectively perform the same operations as the corresponding units of the distortion compensating apparatus 100. However, a predistortion coefficient in the DPD 214 is a predistortion coefficient calculated by the coefficient calculator 229. In addition, the output of the DPD 214 is also sent to the coefficient calculator 229. Further, a part of the output of the amplifier 224 is also input to the frequency converter 226.

The frequency converter 226 down-converts the output signal of the amplifier 224 from a radio frequency to a baseband frequency. In a case where an input modulated signal is an intermediate frequency signal, the frequency converter 226 down-converts an output signal of the amplifier 224 from a radio frequency to the intermediate frequency.

The quadrature demodulator 227 demodulates an output of the frequency converter 226 into an in-phase signal and a quadrature signal.

The ADC 228 converts the signal output from the quadrature demodulator 227 into a digital signal.

The coefficient calculator 229 calculates a predistortion coefficient. The coefficient calculator 229 receives the digital signal output from the DPD 214. In addition, the coefficient calculator 229 receives the digital signal output from the ADC 228. The coefficient calculator 229 compares the digital signal output from the DPD 214 with the digital signal output from the ADC 228, thereby calculating a predistortion coefficient. The coefficient calculator 229 compares the phase and the amplitude of the digital signal output from the DPD 214 with the phase and the amplitude of the digital signal output from the ADC 228. The coefficient calculator 229 may calculate the amplitude of the output signal to the amplitude of the input signal and a phase rotation through the comparison. In other words, the coefficient calculator 229 may calculate AM/AM distortion and AM/PM distortion. The coefficient calculator 229 calculates a predistortion coefficient that compensates for the AM/AM distortion and the AM/PM distortion. The predistortion coefficient may be calculated at certain time intervals and be updated at certain time intervals. The predistortion coefficient may be calculated at certain intervals on the basis of an input signal and an output signal in a certain time period. The predistortion coefficient may be calculated for every predetermined number of input signals and output signals. The predistortion coefficient may be updated each time an input signal and an output signal are input. The coefficient calculator 229 may transmit a table indicating a correspondence relationship between an input signal and a predistortion coefficient to the DPD 214 at certain time intervals. In a case where the table is transmitted from the coefficient calculator 229, the DPD 214 stores the table.

The combiner 252 combines the signal output from the amplifier 224 with the signal output from the amplifier 244 and outputs the combined signal.

The first low-pass filter 232, the DPD 234, and the DAC 236 are respectively the same as the first low-pass filter 212, the DPD 214, and the DAC 216. The second low-pass filter 238, the quadrature modulator 240, the frequency converter 242, and the amplifier 244 are respectively the same as second low-pass filter 218, the quadrature modulator 220, the frequency converter 222, and the amplifier 224. The frequency converter 246, the quadrature demodulator 247, the ADC 248, and the coefficient calculator 249 are respectively the same as frequency converter 226, the quadrature demodulator 227, the ADC 228, and the coefficient calculator 229.

Operation Example

An operation of the distortion compensating apparatus 200 will be described.

Figure 14:
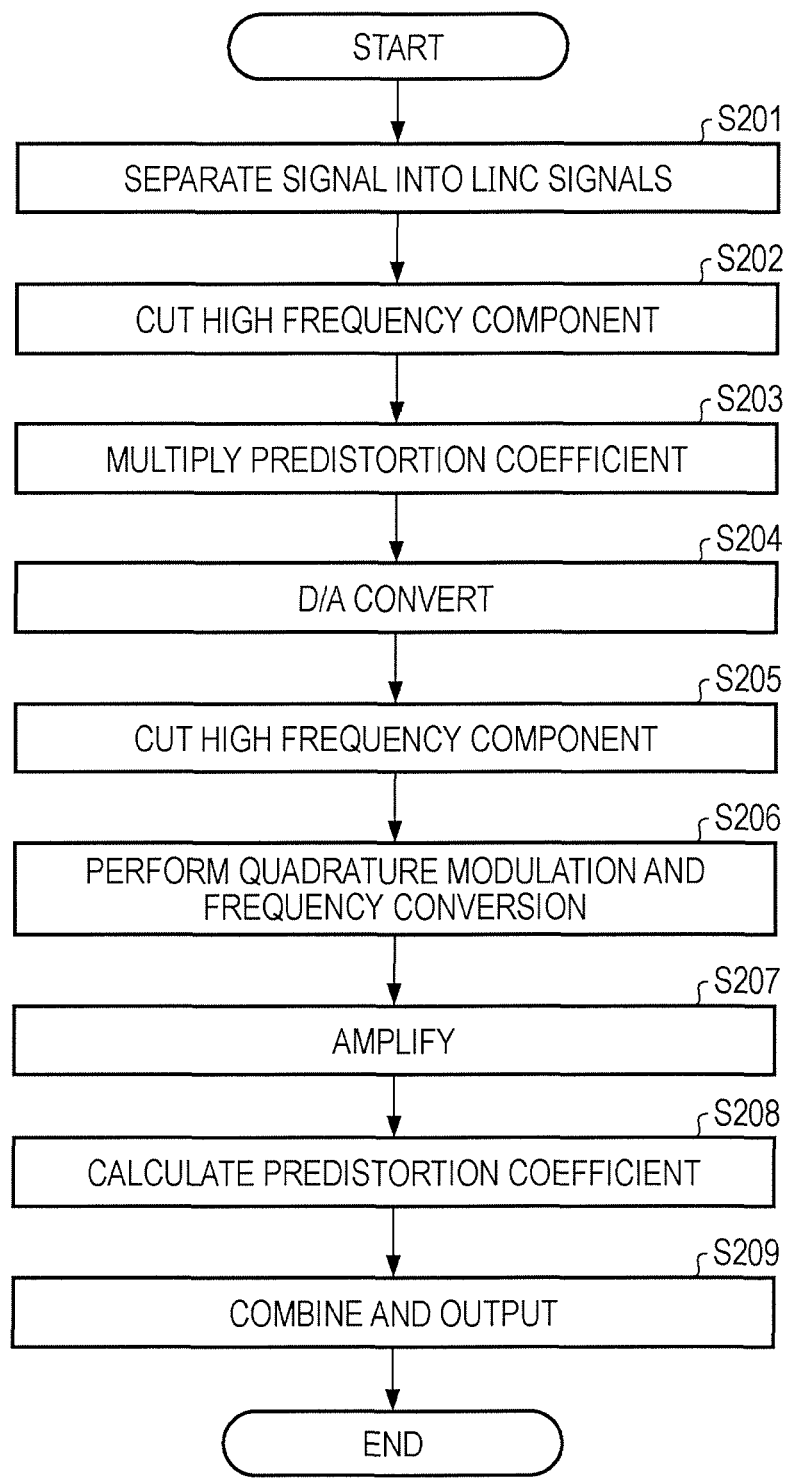
FIG. 14 is a diagram illustrating an example of an operation flow of the distortion compensating apparatus.

FIG. 14 is a diagram illustrating an example of the operation flow of the distortion compensating apparatus 200. The LINC signal generator 202 of the distortion compensating apparatus 200 receives a digital signal Sin(t) which is a signal to be transmitted. The LINC signal generator 202 separates the received digital signal Sin(t) into a pair of phase-modulated signals Sc1(t) and Sc2(t) having a phase difference corresponding to the amplitude of the received digital signal Sin(t) (operation S201). The LINC signal generator 202 outputs the signal Sc1(t) to the first low-pass filter 212. The LINC signal generator 202 outputs the signal Sc2(t) to the first low-pass filter 232. The signals output from the LINC signal generator 202 are expressed, for example, using an amplitude and a phase. In addition, the signals output from the LINC signal generator 202 may be expressed using an in-phase (I) component and a quadrature phase (Q) component.

The first low-pass filter 212 cuts a high frequency component of the signal Sc1(t) (operation S202). The signal from which the high frequency component is cut is input to the DPD 214. A frequency band with band limitation by the first low-pass filter 212 is the same as a frequency band of the analog signal by the second low-pass filter 218 or is smaller than a frequency band of the analog signal by the second low-pass filter 218. Ringing occurs in a signal having passed through the first low-pass filter 212. In other words, even if a signal input to the first low-pass filter 212 is a constant envelope signal, an amplitude component of a signal output from the first low-pass filter 212 is not constant.

The DPD 214 multiplies the signal output from the first low-pass filter 212 by a predistortion coefficient and outputs the multiplied signal (operation S203). The predistortion coefficient is a coefficient that compensates for distortion (AM/AM distortion and AM/PM distortion) in the amplifier 224. The predistortion coefficient is calculated by the coefficient calculator 229. In the DPD 214, inverse characteristics to distortion characteristics given by the amplifier 224 is given by the predistortion coefficient to the signal output from the first low-pass filter 212. The predistortion coefficient is dependent on the amplitude of the signal output from the first low-pass filter 212. The DPD 214 may store a correspondence relationship between the signal and the predistortion coefficient, calculated by the coefficient calculator 229, as a table. The DPD 214 outputs the signal which is multiplied by the predistortion coefficient to the DAC 216 and the coefficient calculator 229.

The signal obtained by multiplying the signal output from the first low-pass filter 212 by the predistortion coefficient is input to the amplifier 224, thereby obtaining a desired output in which distortion is suppressed.

The DAC 216 converts the digital signal output from the DPD 214 into an analog signal (operation S204).

The second low-pass filter 218 cuts a high frequency component of the analog signal converted by the DAC 216 (operation S205). The analog signal converted by the DAC 216 (the output of the DAC 216) has a stepped waveform. In other words, the analog signal converted by the DAC 216 includes a high frequency component. Therefore, the second low-pass filter 218 removes the high frequency component. The signal from which the high frequency component is cut is output to the quadrature modulator 220.

The quadrature modulator 220 performs a quadrature modulation on the signal output from the second low-pass filter 218. The frequency converter 222 converts a frequency of the signal output from the quadrature modulator 220 into a radio frequency by using a high frequency signal output from the oscillator, and outputs the frequency-converted signal (operation S206).

The amplifier 224 amplifies the signal output from the frequency converter 222 (operation S207). The signal amplified by the amplifier 224 has been subjected to a distortion compensating process by the DPD 214 in advance.

A part of the signal amplified by the amplifier 224 is also input to the frequency converter 226. The frequency converter 226 down-converts the output signal of the amplifier 224 from a radio frequency to a baseband frequency. The quadrature demodulator 227 demodulates an output of the frequency converter 226 into an in-phase signal and a quadrature signal. The ADC 228 converts the signal output from the quadrature demodulator 227 into a digital signal.

The coefficient calculator 229 calculates a predistortion coefficient (operation S208). The coefficient calculator 229 compares the signal output from the DPD 214 with the signal output from the ADC 228 corresponding to the signal output from the DPD 214. The coefficient calculator 229 compares the phase and the amplitude of the digital signal output from the DPD 214 with the phase and the amplitude of the digital signal output from the ADC 228.

The coefficient calculator 229 calculates a predistortion coefficient that compensates for the AM/AM distortion and the AM/PM distortion through the comparison.

The predistortion coefficient is calculated, for example, as follows. Here, it is assumed that, in relation to an input signal ($A \cdot \exp(i\theta)$, or an output signal of the DPD 214) with the amplitude A and the phase $\theta$, an output signal ($B \cdot \exp(i(\theta+\phi))$ or an output signal of the ADC 228) with the amplitude B and the phase ($\theta+\phi$) is output. Here, it is assumed that the amplitude B of the output signal is dependent on the amplitude A of the input signal and is not dependent on the phase $\theta$ of the input signal. In addition, it is assumed that the phase rotation $\phi$ of the output signal is dependent on the amplitude A of the input signal, and is not dependent on the phase $\theta$ of the input signal. At this time, in order to obtain an output signal with the amplitude B and the phase $\psi$ for an input signal ($C \cdot \exp(i\psi)$ or an output signal of the first low-pass filter 212) with the amplitude C and the phase $\psi$, the predistortion coefficient may be $(A/B) \cdot \exp(-i\phi)$. When the input signal ($C \cdot \exp(i\psi)$) with the amplitude C and the phase $\psi$ is multiplied by the predistortion coefficient, an input signal after distortion compensation is performed becomes $A \cdot \exp(i(\psi-\phi))$. A signal ($B \cdot \exp(i\psi)$) with the desired amplitude B and phase $\psi$ may be obtained as an output signal for the input signal after the distortion compensation is performed. The predistortion coefficient may also be calculated similarly in other embodiments.

In the coefficient calculator 229 and the coefficient calculator 249, a predistortion coefficient is calculated such that the same output is obtained for the same input by the amplifier 224 and the amplifier 244.

The signal Sc2(t) output from the LINC signal generator 202 is processed by the first low-pass filter 232, the DPD 234, the DAC 236, the second low-pass filter 238, the quadrature modulator 240, the frequency converter 242, and the amplifier 244 in the same manner as the signal Sc1(t). The signal Sc2(t) is processed by the frequency converter 246, the quadrature demodulator 247, the ADC 248, and the coefficient calculator 249 in the same manner as the signal Sc1(t).

On the other hand, the combiner 252 combines the signal output from the amplifier 224 with the signal output from the amplifier 244 and outputs the combined signal (operation S209). The output signal is transmitted to other apparatuses using the antenna or the like.

The distortion compensating apparatus 200 cuts the high frequency component of the digital signal generated by the LINC signal generator 202 so as to perform a digital predistortion process (a distortion compensating process) on the digital signal.

Figure 15:
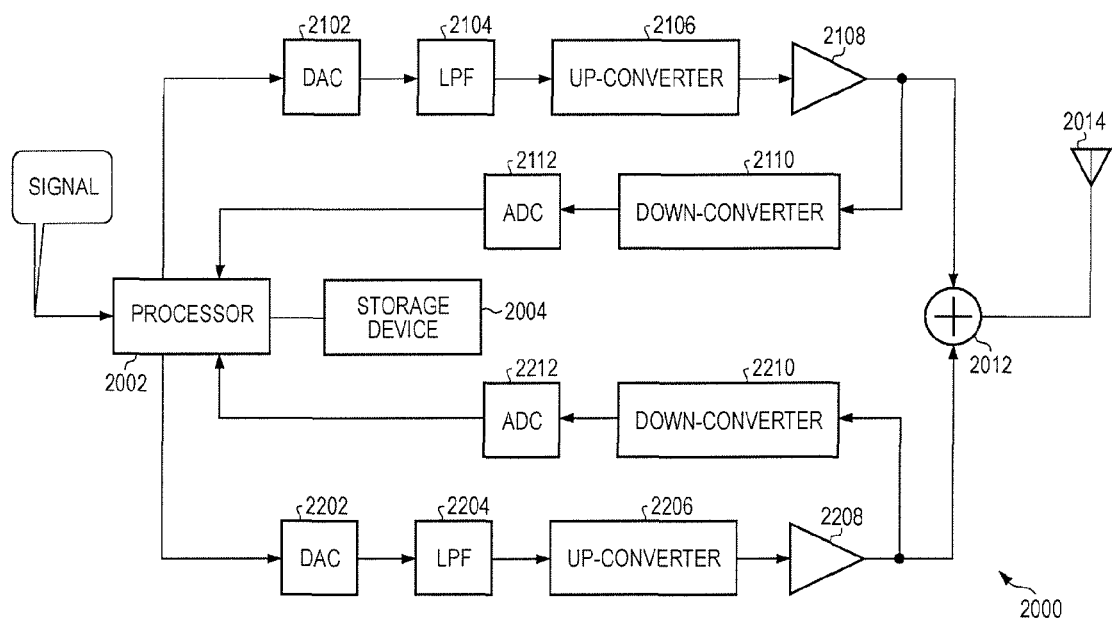
FIG. 15 is a diagram illustrating a hardware configuration example of the distortion compensating apparatus according to Second Embodiment.

Hardware Configuration Example of Distortion Compensating Apparatus According to Second Embodiment FIG. 15 is a hardware configuration example of the distortion compensating apparatus according to Second Embodiment. The distortion compensating apparatus 2000 up-converts an input digital signal into a signal with a radio frequency, and amplifies and outputs the up-converted signal.

The distortion compensating apparatus 2000 down-converts a part of an output of an amplifier and converts the part of the output into a digital signal, thereby calculating a predistortion coefficient. The distortion compensating apparatus 2000 includes a processor 2002, a storage device 2004, a DAC 2102, an LPF 2104, an up-converter 2106, an amplifier 2108, a down-converter 2110, and an ADC 2112. The distortion compensating apparatus 2000 further includes a DAC 2202, an LPF 2204, an up-converter 2206, an amplifier 2208, a down-converter 2210, an ADC 2212, a combiner 2012, and an antenna 2014. The distortion compensating apparatus 200 is implemented by a hardware configuration such as, for example, the distortion compensating apparatus 2000.

The processor 2002 is, for example, a CPU or a DSP. The processor 2002 controls the entire distortion compensating apparatus 2000. As the processor 2002, an ASIC or an FPGA may be used.

The storage device 2004 is, for example, a RAM or a ROM. In addition, the storage device 2004 is, for example, an EPROM or a hard disk drive (HDD). Further, a secondary storage device may include a removable medium, that is, a portable recording medium. The removable medium is, for example, a USB memory, or a disk storage medium such as, a CD or a DVD. The storage device 2004 may store a correspondence table or the like indicating a correspondence relationship between an input signal and a predistortion coefficient.

The distortion compensating apparatus 2000 realizes the functions of the LINC signal generator 202, the first low-pass filter 212, the DPD 214, the coefficient calculator 229 and the like by the processor 2002 executing a program stored in the storage device 2004.

The DAC 2102 converts a digital signal output from the processor 2002 into an analog signal. The DAC 2102 realizes the function of the DAC 216.

The LPF 2104 removes a high frequency component from the analog signal output from the DAC 2102. The LPF 2104 realizes a function of the second low-pass filter 218.

The up-converter 2106 has the functions of the quadrature modulator 220 and the frequency converter 222.

The amplifier 2108 amplifies the analog signal output from the up-converter 2106. Various amplifiers may be used as the amplifier 2108, and the amplifier 2108 and the amplifier 2208 preferably use amplifiers having the same characteristics.

The down-converter 2110 has the functions of the frequency converter 226 and the quadrature demodulator 227.

The DAC 2202, the LPF 2204, the up-converter 2206, and the amplifier 2208 respectively have the same functions as the DAC 2102, the LPF 2104, the up-converter 2106, and the amplifier 2108. The down-converter 2210 and the ADC 2212 respectively have the same functions as the down-converter 2110 and the ADC 2112.

The combiner 2012 combines the output of the amplifier 2108 with the output of amplifier 2208.

The antenna 2014 transmits the signal combined by the combiner 2012 to other apparatuses.

Operations and Effects of Second Embodiment

The distortion characteristics of the amplifier 224 or the amplifier 244 may vary due to deterioration with the time, operating ambient conditions (temperature, for example), and the like. The distortion compensating apparatus 200 calculates a predistortion coefficient, for example, at certain time intervals by using an output of the DPD and an output of the ADC, and thereby it is possible to perform more appropriate distortion compensation even in a case where the distortion characteristics of the amplifier vary.

Third Embodiment

Next, Third Embodiment will be described. Third Embodiment has common features with Embodiments 1 and 2. Therefore, differences from Embodiments 1 and 2 will be mainly described, and description of the common features will be omitted.

In Second Embodiment, a digital predistortion coefficient for each amplifier is obtained based on an output signal of each amplifier. In Third Embodiment, inverse characteristics of an amplifier are calculated based on an output signal of a combiner.

Configuration Example

Figure 16:
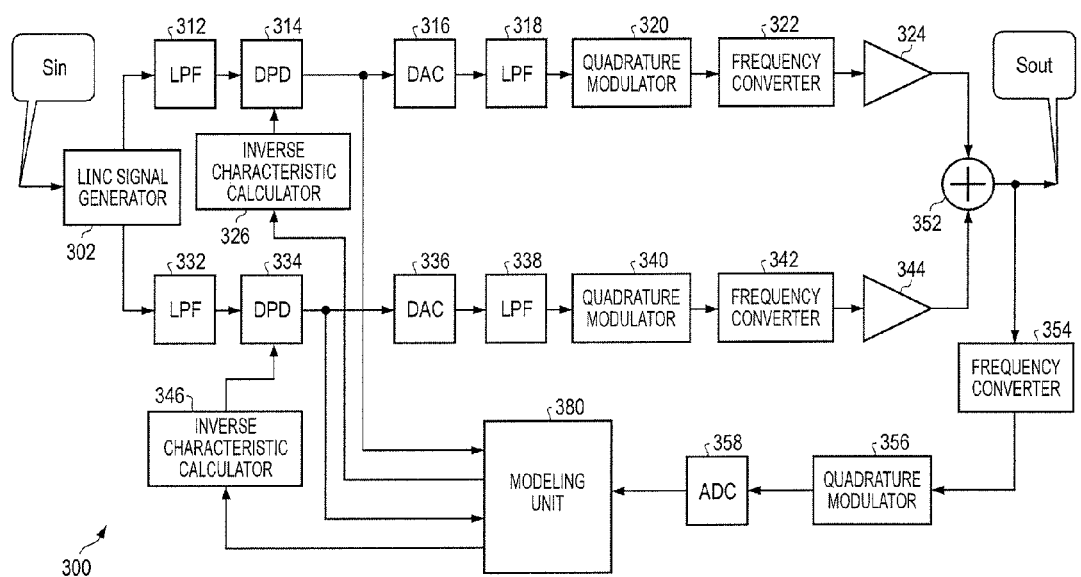
FIG. 16 is a diagram illustrating a configuration example of a distortion compensating apparatus according to Third Embodiment.

FIG. 16 is a diagram illustrating a configuration example of the distortion compensating apparatus according to Third Embodiment. The distortion compensating apparatus 300 includes a LINC signal generator 302, a first low-pass filter 312, a DPD 314, a DAC 316, a second low-pass filter 318, a quadrature modulator 320, a frequency converter 322, an amplifier 324, and an inverse characteristic calculator 326. In addition, the distortion compensating apparatus 300 includes a first low-pass filter 332, a DPD 334, a DAC 336, a second low-pass filter 338, a quadrature modulator 340, a frequency converter 342, an amplifier 344, and an inverse characteristic calculator 346. The distortion compensating apparatus 300 further includes a combiner 352, a frequency converter 354, a quadrature demodulator 356, an ADC 358, and a modeling unit 380.

The LINC signal generator 302, the first low-pass filter 312, the DPD 314, and the DAC 316 respectively perform approximately the same operations as the corresponding units of the distortion compensating apparatus 100. The second low-pass filter 318, the quadrature modulator 320, the frequency converter 322, and the amplifier 324 respectively perform approximately the same operations as the corresponding units of the distortion compensating apparatus 100. However, a predistortion coefficient in the DPD 314 is a predistortion coefficient calculated by the inverse characteristic calculator 326. In addition, the output of the DPD 314 is also sent to the modeling unit 380. A part of the output of the combiner 352 is also input to the frequency converter 354.

The frequency converter 354 down-converts the output signal of the combiner 352 from a radio frequency to a baseband frequency. In a case where an input modulated signal is an intermediate frequency signal, the frequency converter 354 down-converts an output signal of the combiner 352 from a radio frequency to the intermediate frequency.

The quadrature demodulator 356 demodulates an output of the frequency converter 354 into an in-phase signal and a quadrature signal.

The ADC 358 converts the signal output from the quadrature demodulator 356 into a digital signal.

The modeling unit 380 simulates the amplifier 324, the amplifier 344, the combiner 352, and the like. The modeling unit 380 receives a digital signal output from the DPD 314, a digital signal output from the DPD 334, and a digital signal output from the ADC 358. The modeling unit 380 receives the digital signals until the received digital signals reach a predetermined number of samples. Here, the digital signal output from the DPD 314 is indicated by $p_i$, the digital signal output from the DPD 334 is indicated by $q_i$, and the digital signal output from the ADC 358 is indicated by $r_i$. The subscript i indicates an i-th digital signal which is received by the modeling unit 380. Here, the predetermined number of samples is set to N. N may be, for example, 100 or 1000. A value of N is not limited thereto. Here, a function for simulating an output when the signal $p_i$ is input to the amplifier 324 is indicated by $g(p_i)$, and a function for simulating an output when the signal $q_i$ is input to the amplifier 344 is indicated by $h(q_i)$. The functions $g(p_i)$ and $h(q_i)$ are expressed, for example, as follows.

$$g(p_i) = \sum_{n=1}^{M} g_n |p_i|^{2(n-1)} p_i$$

$$h(q_i) = \sum_{n=1}^{M} h_n |q_i|^{2(n-1)} q_i$$

where M is a constant and a natural number. As a value of M is larger, an output of the amplifier is simulated with higher accuracy. A value of M may be, for example, 3 or 5. A value of M is not limited thereto. In addition, $g_n$ and $h_n$ are coefficients for determining shapes of the functions.

The modeling unit 380 determines values of the coefficients $g_n$ and $h_n$ such that $\epsilon$ expressed in the following Equation becomes 0 (the absolute value of $\epsilon$ becomes the minimum). As methods for determining the coefficients $g_n$ and $h_n$, any method may be used. The modeling unit 380 calculates the function g and the function h every predetermined number N of samples.

$$\sum_{i=1}^{N} \{g(p_i) + h(q_i) - r_i\} = \varepsilon$$

where the signal $r_i$ includes influence of the combiner 352, and the function $g(p_i)+h(q_i)$ includes influence of the combiner 352. The modeling unit 380 transmits the function g, the coefficients of which are obtained, to the inverse characteristic calculator 326. The modeling unit 380 transmits the function h, the coefficients of which are obtained, to the inverse characteristic calculator 346.

The inverse characteristic calculator 326 calculates a predistortion coefficient. The inverse characteristic calculator 326 calculates the predistortion coefficient on the basis of the function g which is output from the modeling unit 380. A relationship between the output of the DPD 314 and the output of the amplifier 324 may be obtained from the function g. By using the relationship obtained from the function g, the inverse characteristic calculator 326 calculates the predistortion coefficient in the same manner as in the above-described embodiments. The inverse characteristic calculator 326 outputs the calculated predistortion coefficient to the DPD 314. The inverse characteristic calculator 326 may transmit a table indicating a correspondence relationship between the input signal and the predistortion coefficient to the DPD 314 at certain time intervals. The DPD 314 stores the table when the table is transmitted from the inverse characteristic calculator 326.

The first low-pass filter 332, the DPD 334, and the DAC 336 are respectively the same as the first low-pass filter 312, the DPD 314, and the DAC 316. The second low-pass filter 338, the quadrature modulator 340, the frequency converter 342, the amplifier 344, and the inverse characteristic calculator 346 are respectively the same as the second low-pass filter 318, the quadrature modulator 320, the frequency converter 322, the amplifier 324, and the inverse characteristic calculator 326.

The inverse characteristic calculator 326, the inverse characteristic calculator 346, and the modeling unit 380 may be integrated so as to operate as a calculator.

Operation Example

An operation of the distortion compensating apparatus 300 will be described.

Figure 17:
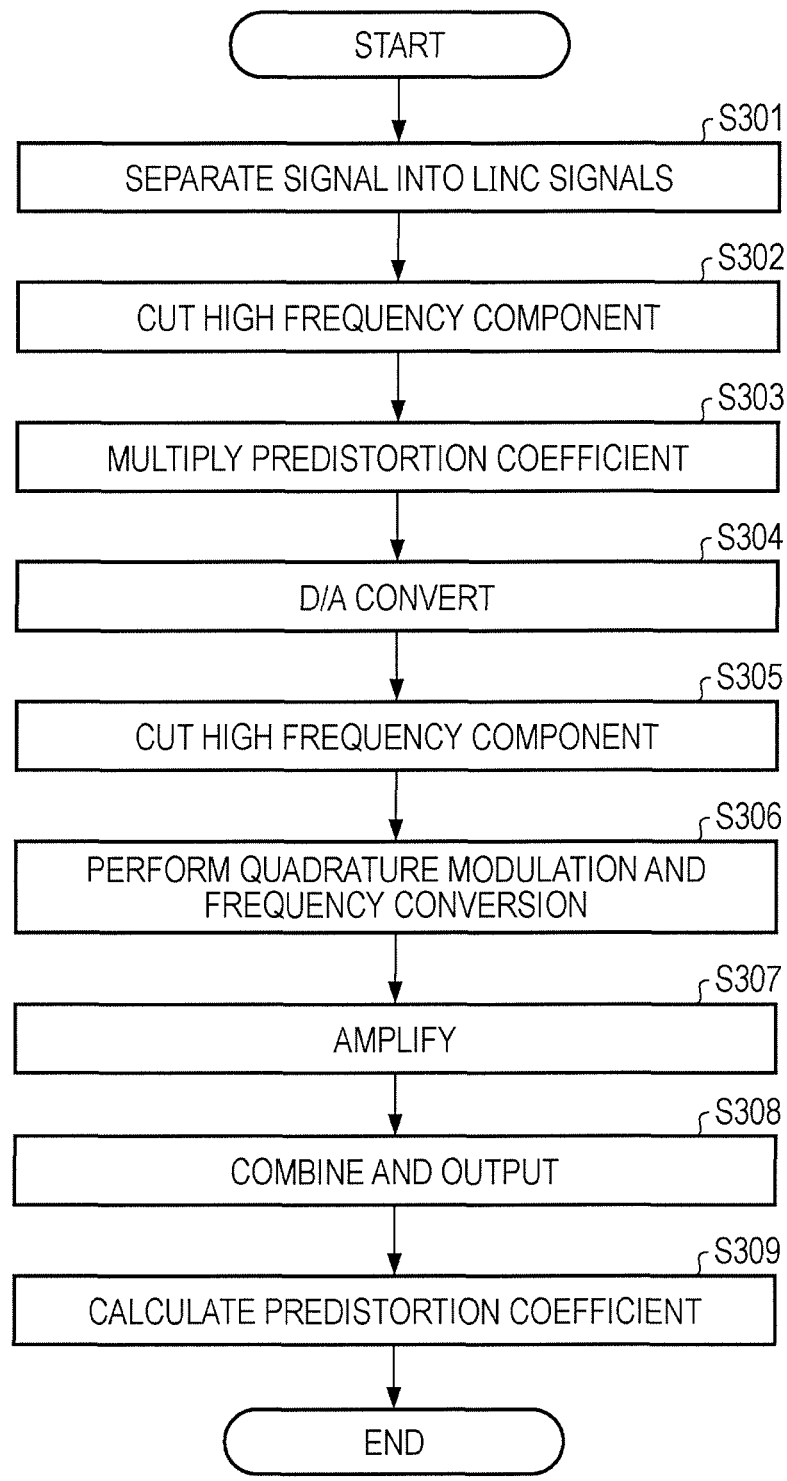
FIG. 17 is a diagram illustrating an example of an operation flow of the distortion compensating apparatus.

FIG. 17 is a diagram illustrating an example of the operation flow of the distortion compensating apparatus 300. The LINC signal generator 302 of the distortion compensating apparatus 300 receives a digital signal Sin(t) which is a signal to be transmitted. The LINC signal generator 302 separates the received digital signal Sin(t) into a pair of phase-modulated signals Sc1(t) and Sc2(t) having a phase difference corresponding to the amplitude of the received digital signal Sin(t) (operation S301). The LINC signal generator 302 outputs the signal Sc1(t) to the first low-pass filter 312. The LINC signal generator 302 outputs the signal Sc2(t) to the first low-pass filter 332. The signals output from the LINC signal generator 302 are expressed, for example, using an amplitude and a phase. In addition, the signals output from the LINC signal generator 302 may be expressed using an I component and a Q component.

The first low-pass filter 312 cuts a high frequency component of the signal Sc1(t) (operation S302). The signal from which the high frequency component is cut is input to the DPD 314. A frequency band with band limitation by the first low-pass filter 312 is the same as a frequency band of the analog signal by the second low-pass filter 318 or is smaller than the frequency band of the analog signal by the second low-pass filter 318. Ringing occurs in a signal having passed through the first low-pass filter 312. In other words, even if a signal input to the first low-pass filter 312 is a constant envelope signal, an amplitude component of a signal output from the first low-pass filter 312 is not constant.

The DPD 314 multiplies the signal output from the first low-pass filter 312 by a predistortion coefficient and outputs the multiplied signal (operation S303). The predistortion coefficient is calculated by the inverse characteristic calculator 326. In the DPD 314, inverse characteristics to distortion characteristics given by the amplifier 324 is given by the predistortion coefficient to the signal output from the first low-pass filter 312. The predistortion coefficient is dependent on the amplitude of the signal output from the first low-pass filter 312. The DPD 314 may store a correspondence relationship between the signal and the predistortion coefficient, calculated by the inverse characteristic calculator 326, as a table. The DPD 314 outputs the signal which has been multiplied by the predistortion coefficient to the DAC 316 and the modeling unit 380.

The signal obtained by multiplying the signal output from the first low-pass filter 312 by the predistortion coefficient is input to the amplifier 324, thereby obtaining a desired output in which distortion is suppressed.

The DAC 316 converts the digital signal output from the DPD 314 into an analog signal (operation S304).

The second low-pass filter 318 cuts a high frequency component of the analog signal converted by the DAC 316 (operation S305). The analog signal converted by the DAC 316 (the output of the DAC 316) has a stepped waveform. In other words, the analog signal converted by the DAC 316 includes a high frequency component. Therefore, the second low-pass filter 318 removes the high frequency component. The signal from which the high frequency component is cut is input to the quadrature modulator 320.

The quadrature modulator 320 performs a quadrature modulation on the signal output from the second low-pass filter 318. The frequency converter 322 converts a frequency of the signal output from the quadrature modulator 320 into a radio frequency by using a high frequency signal output from the oscillator and outputs the frequency-converted signal (operation S306).

The amplifier 324 amplifies a signal output from the frequency converter 322 (operation S307). The signal amplified by the amplifier 324 has been subjected to a distortion compensating process by the DPD 314 in advance.

The signal Sc2(t) output from the LINC signal generator 302 is processed by the first low-pass filter 332, the DPD 334, the DAC 336, the second low-pass filter 338, the quadrature modulator 340, the frequency converter 342, and the amplifier 344 in the same manner as the signal Sc1(t).

The combiner 352 combines the signal output from the amplifier 324 with the signal output from the amplifier 344, so as to output the combined signal (operation S308). The output signal is transmitted to other apparatuses using the antenna or the like. In addition, a part of the output signal is input to the frequency converter 354.

The frequency converter 354 down-converts the output signal of the combiner 352 from a radio frequency to a baseband frequency. The quadrature demodulator 356 demodulates an output of the frequency converter 354 into an in-phase signal and a quadrature signal. The ADC 358 converts the signal output from the quadrature demodulator 356 into a digital signal.

The modeling unit 380 receives a digital signal output from the DPD 314, a digital signal output from the DPD 334, and a digital signal output from the ADC 358. The modeling unit 380 calculates the function g and the function h for simulating the amplifier 324, the amplifier 344, and the combiner 352 each time the modeling unit 380 receives a predetermined number of samples of the digital signals. The modeling unit 380 outputs the calculated function g to the inverse characteristic calculator 326. The modeling unit 380 outputs the calculated function h to the inverse characteristic calculator 346.

The inverse characteristic calculator 326 calculates a predistortion coefficient (operation S309). The inverse characteristic calculator 326 calculates the predistortion coefficient that compensates for the AM/AM distortion and the AM/PM distortion on the basis of the function g. The inverse characteristic calculator 326 outputs the calculated predistortion coefficient to the DPD 314. An operation of the inverse characteristic calculator 346 is the same as the operation of the inverse characteristic calculator 326.

Figure 18:
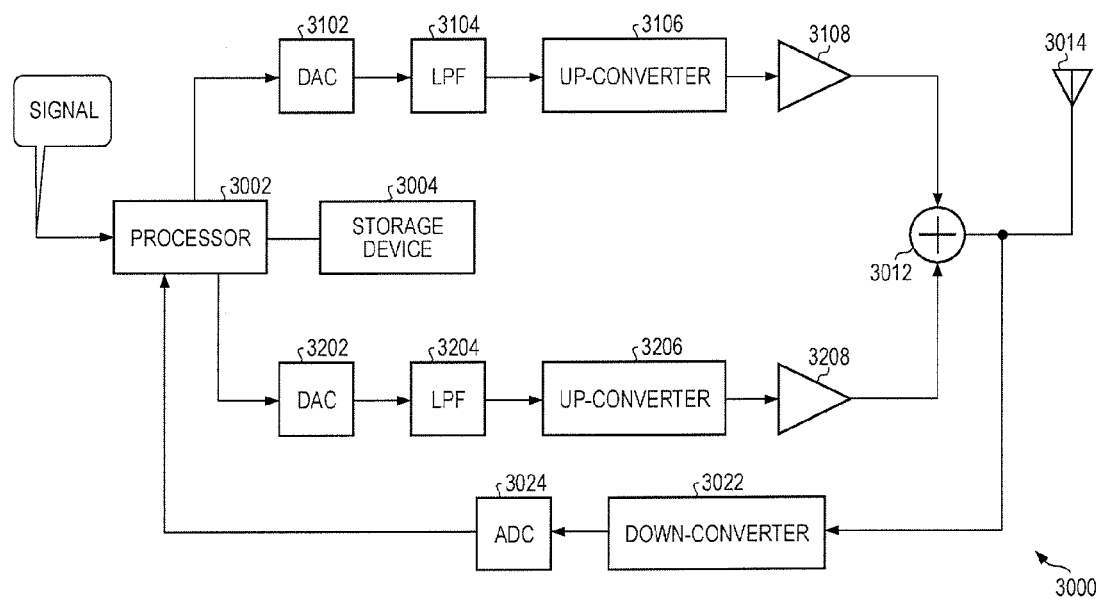
FIG. 18 is a diagram illustrating a hardware configuration example of the distortion compensating apparatus according to Third Embodiment.

Hardware Configuration Example of Distortion Compensating Apparatus According to Third Embodiment FIG. 18 is a hardware configuration example of the distortion compensating apparatus according to Third Embodiment. The distortion compensating apparatus 3000 up-converts an input digital signal into a signal with a radio frequency, and amplifies and outputs the up-converted signal. The distortion compensating apparatus 3000 down-converts a part of an output of an amplifier, converts the part into a digital signal, and simulates the amplifier, the combiner and the like, thereby calculating a predistortion coefficient. The distortion compensating apparatus 3000 includes a processor 3002, a storage device 3004, a DAC 3102, an LPF 3104, an up-converter 3106, and an amplifier 3108. The distortion compensating apparatus 3000 further includes a DAC 3202, an LPF 3204, an up-converter 3206, and an amplifier 3208. In addition, the distortion compensating apparatus 3000 includes a combiner 3012, an antenna 3014, a down-converter 3022, and an ADC 3024. The distortion compensating apparatus 300 is implemented by a hardware configuration such as, for example, the distortion compensating apparatus 3000.

The processor 3002 is, for example, a CPU or a DSP. The processor 3002 controls the entire distortion compensating apparatus 3000. As the processor 3002, an application specific integrated circuit (ASIC) or an FPGA may be used.

The storage device 3004 is, for example, a RAM or a ROM. In addition, the storage device 3004 is, for example, an EPROM or a hard disk drive (HDD). Further, a secondary storage device may include a removable medium, that is, a portable recording medium. The removable medium is, for example, a USB memory, or a disk storage medium such as, a CD or a DVD. The storage device 3004 may store a correspondence table or the like indicating a correspondence relationship between an input signal and a predistortion coefficient.

The distortion compensating apparatus 3000 realizes functions of the LINC signal generator 302, the first low-pass filter 312, the DPD 314, the inverse characteristic calculator 326, the modeling unit 380 and the like by the processor 3002 executing a program stored in the storage device 3004.

The DAC 3102 converts a digital signal output from the processor 3002 into an analog signal. The DAC 3102 realizes the function of the DAC 316.

The LPF 3104 removes a high frequency component from the analog signal output from the DAC 3102. The LPF 3104 realizes the function of the second low-pass filter 318.

The up-converter 3106 has the functions of the quadrature modulator 320 and the frequency converter 322.

The amplifier 3108 amplifies the analog signal output from the up-converter 3106. Various amplifiers may be used as the amplifier 3108, and the amplifier 3108 and the amplifier 3208 preferably use amplifiers having the same characteristics.

The down-converter 3022 has the functions of the frequency converter 354 and the quadrature demodulator 356.

The DAC 3202, the LPF 3204, the up-converter 3206, and the amplifier 3208 respectively have the same functions as the DAC 3102, the LPF 3104, the up-converter 3106, and the amplifier 3108.

The combiner 3012 combines the output of the amplifier 3108 with the output of amplifier 3208.

The antenna 3014 transmits the signal combined by the combiner 3012 to other apparatuses.

Operations and Effects of Third Embodiment

The distortion compensating apparatus 300 simulates characteristics of the amplifier, the combiner, and the like by using an output of the combiner 352. The distortion compensating apparatus 300 may compensate for the characteristics of the combiner 352, the distortion characteristics of the amplifier, and unbalance between the amplifier 324 and the like which process the signal Sc1(t) and the amplifier 344 and the like which process the signal Sc2(t). The distortion compensating apparatus 300 suppresses deterioration in an output of the combiner 352.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplification device using linear amplification with non-linear components (LINC), the amplification device comprising:
   a signal generator configured to:
      receive an input signal, and
      output a first digital signal and a second digital signal, the first digital signal and the second digital signal each being phase modulated with a constant amplitude, and the second digital signal having a phase difference from the first digital signal based on an amplitude of the input signal;
   a first filter configured to:
      receive the first digital signal from the signal generator,
      pass a predetermined frequency component of the received first digital signal and
      output a first filtered signal;
   a first distortion compensator configured to:
      receive the first filtered signal from the first filter,
      perform, on the first filtered signal from the first filter, a distortion compensation process for generating a first distortion compensated signal using a first distortion compensation coefficient established based on a magnitude of the output of the first filter, wherein the first distortion compensated signal compensates in advance for an amplifier created distortion, and
      output the first distortion compensated signal;
   a first digital to analog converter configured to convert the first distortion compensated signal into a first analog signal;
   a first amplifier configured to amplify the first analog signal into the first amplified analog signal;
   a second filter configured to:
      receive the second digital signal from the signal generator,
      pass a predetermined frequency component of the received second digital signal, and
      output a second filtered signal;
   a second distortion compensator configured to:
      receive the second filtered signal from the second filter,
      perform, on the second filtered signal from the second filter, a distortion compensation process for generating a second distortion compensated signal using a second distortion compensation coefficient established based on a magnitude of the output of the second filter, wherein the second distortion compensated signal compensates in advance for an amplifier created distortion; and
      output the second distortion compensated signal;
   a second digital to analog converter configured to convert the second distortion compensated signal into a second analog signal;
   a second amplifier configured to amplify the second analog signal into the second amplified analog signal; and
   a combiner configured to combine the first amplified analog signal with the second amplified analog signal into a combined output signal.

2. The amplification device according to claim 1, further comprising:
   a first coefficient calculator configured to calculate the first distortion compensation coefficient, based on the first distortion compensated signal output by the first distortion compensator and the first amplified analog signal; and
   a second coefficient calculator configured to calculate the second distortion compensation coefficient, based on the second distortion compensated signal output by the second distortion compensator and the second amplified analog signal.

3. The amplification device according to claim 1, further comprising:
   a calculator configured to calculate the first distortion compensation coefficient and the second distortion compensation coefficient, based on the first distortion compensated signal output by the first distortion compensator and the second distortion compensated signal output by the second distortion compensator, respectively, and the combined output signal.

4. An amplification method for an amplifier using linear amplification with non-linear components (LINC), the amplification method comprising:
   generating, from an input signal, a first digital signal and a second digital signal, the first digital signal and the second digital signal each being phase modulated with a constant amplitude, the second digital signal having a phase difference from the first digital signal based on an amplitude of the input signal;
   passing, via a first filter, a predetermined frequency component of the first digital signal and resulting in a first filtered signal;
   performing, on the first filtered signal, a distortion compensation process for generating a first distortion compensated signal using a first distortion compensation coefficient established based on a magnitude of the output of the first filter, wherein the first distortion compensated signal compensates in advance for an amplifier created distortion;
   converting from the first distortion compensated signal into a first analog signal;
   amplifying the first analog signal into a first amplified analog signal;
   passing, via a second filter, a predetermined frequency component of the second digital signal and resulting in a second filtered signal;
   performing, on the second filtered signal, a distortion compensation process for generating a second distortion compensated signal using a second distortion compensation coefficient established based on a magnitude of the output of the second filter, wherein the second distortion compensated signal compensates in advance for an amplifier created distortion;
   converting from the second distortion compensated signal into a second analog signal;
   amplifying the second analog signal into a second amplified analog signal; and
   combining the first amplified analog signal with the second amplified analog signal into a combined output signal.

5. The amplification method according to claim 4, wherein:
   the first distortion compensation coefficient is calculated based on the first distortion compensated filtered signal compensated based on the first distortion compensation coefficient and the first amplified analog signal, and
   the second compensation coefficient is calculated based on the second distortion compensated signal and the second amplified analog signal.

6. The amplification method according to claim 4, wherein the first distortion compensation coefficient and the second distortion compensation coefficient are calculated based on the first distortion compensated signal and the second distortion compensated signal, respectively, and the combined output signal.

* * * * *